US011923385B2

(12) United States Patent
Fukui

(10) Patent No.: US 11,923,385 B2
(45) Date of Patent: Mar. 5, 2024

(54) SOLID-STATE IMAGING DEVICE AND SOLID-STATE IMAGING APPARATUS

(71) Applicant: SONY SEMICONDUCTOR SOLUTIONS CORPORATION, Kanagawa (JP)

(72) Inventor: Hironobu Fukui, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 225 days.

(21) Appl. No.: 17/049,780

(22) PCT Filed: Apr. 8, 2019

(86) PCT No.: PCT/JP2019/015255
§ 371 (c)(1),
(2) Date: Oct. 22, 2020

(87) PCT Pub. No.: WO2019/220810
PCT Pub. Date: Nov. 21, 2019

(65) Prior Publication Data
US 2021/0242254 A1    Aug. 5, 2021

(30) Foreign Application Priority Data
May 16, 2018    (JP) .................................. 2018-094226

(51) Int. Cl.
*H01L 27/146*    (2006.01)
(52) U.S. Cl.
CPC .. *H01L 27/14603* (2013.01); *H01L 27/14612* (2013.01); *H01L 27/14643* (2013.01)

(58) Field of Classification Search
CPC ......................................... H01L 27/146–14893
See application file for complete search history.

(56) References Cited

U.S. PATENT DOCUMENTS 11,094,725 B2 *    8/2021    Tanaka ................ H01L 27/1461
2010/0090095 A1 *    4/2010    Han .................. H01L 27/14636
                                                            250/214 R
(Continued)

FOREIGN PATENT DOCUMENTS

CN    101452942 A    6/2009
CN    102196198 A    9/2011
(Continued)

OTHER PUBLICATIONS

International Search Report and Written Opinion prepared by the Japanese Patent Office dated Jun. 17, 2019, for International Application No. PCT/JP2019/015255.

*Primary Examiner* — Evren Seven
*Assistant Examiner* — Cole Leon Lindsey
(74) *Attorney, Agent, or Firm* — SHERIDAN ROSS P.C.

(57) ABSTRACT

A solid-state imaging device including: a semiconductor substrate having a first surface and a second surface opposed to each other, and including a photoelectric converter provided for each of pixel regions; an impurity diffusion region provided, for each of the pixel regions, in proximity to the first surface of the semiconductor substrate; and a contact electrode embedded in the semiconductor substrate from the first surface, and provided over and in contact with the impurity diffusion regions each provided for each of the pixel regions adjacent to each other.

20 Claims, 24 Drawing Sheets

(56) References Cited

U.S. PATENT DOCUMENTS

| | | | |
|---|---|---|---|
| 2010/0177226 A1 | 7/2010 | Itonaga | |
| 2011/0128400 A1 | 6/2011 | Wakano | |
| 2013/0313622 A1 | 11/2013 | Kuroda | |
| 2016/0020236 A1 | 1/2016 | Tanaka et al. | |
| 2016/0043130 A1* | 2/2016 | Ohguro | H01L 27/14638 257/225 |
| 2018/0190694 A1 | 7/2018 | Ihara | |

FOREIGN PATENT DOCUMENTS

| | | | | |
|---|---|---|---|---|
| CN | 102576723 A | 7/2012 | | |
| CN | 104347658 A | 2/2015 | | |
| CN | 104428897 A | 3/2015 | | |
| CN | 106169492 A | 11/2016 | | |
| CN | 107564926 A | 1/2018 | | |
| EP | 1017106 A2 * | 7/2000 | | H01L 27/14603 |
| JP | H05-090203 | 4/1993 | | |
| JP | H08-130309 | 5/1996 | | |
| JP | 2005-302914 | 10/2005 | | |
| JP | 2005302914 A * | 10/2005 | | |
| JP | 2010-219233 | 9/2010 | | |
| JP | 2012-114479 | 6/2012 | | |
| JP | 2014099626 A | 5/2014 | | |
| JP | 2014-199898 | 10/2014 | | |
| JP | 2016-039315 | 3/2016 | | |
| KR | 20100131353 A | 12/2010 | | |
| WO | WO 2014/185039 | 11/2014 | | |

* cited by examiner

SOLID-STATE IMAGING DEVICE AND SOLID-STATE IMAGING APPARATUS

CROSS REFERENCE TO RELATED APPLICATIONS

This application is a national stage application under 35 U.S.C. 371 and claims the benefit of PCT Application No. PCT/JP2019/015255 having an international filing date of 8 Apr. 2019, which designated the United States, which PCT application claimed the benefit of Japanese Patent Application No. 2018-094226 filed 16 May 2018, the entire disclosures of each of which are incorporated herein by reference.

TECHNICAL FIELD

The present disclosure relates to a solid-state imaging device including a semiconductor substrate, and a solid-state imaging apparatus including the solid-state imaging device.

BACKGROUND ART

In recent years, a solid-state imaging device of a back-side illumination type has been developed (for example, see PTL 1). The solid-state imaging device includes a multilayer wiring layer on a surface of a semiconductor substrate. In the back-side illumination type, light enters the semiconductor substrate from a back surface thereof.

The semiconductor substrate is provided with a photoelectric converter and an electric charge accumulation section in each pixel region, for example. In the electric charge accumulation section, a signal electric charge generated by the photoelectric converter is accumulated. The electric charge accumulation section includes an impurity diffusion region in which an n-type impurity is diffused.

CITATION LIST

Patent Literature

PTL 1: Japanese Unexamined Patent Application Publication No. 2016-39315

SUMMARY OF THE INVENTION

In such a solid-state imaging device, an impurity diffusion region is desired to be shared among a plurality of pixels.

It is therefore desirable to provide a solid-state imaging device and a solid-state imaging apparatus that make it possible to share an impurity diffusion region among a plurality of pixel regions.

A solid-state imaging device according to an embodiment of the present disclosure includes: a semiconductor substrate having a first surface and a second surface opposed to each other, and including a photoelectric converter provided for each of pixel regions; an impurity diffusion region provided, for each of the pixel regions, in proximity to the first surface of the semiconductor substrate; and a contact electrode embedded in the semiconductor substrate from the first surface, and provided over and in contact with the impurity diffusion regions each provided for each of the pixel regions adjacent to each other.

A solid-state imaging apparatus according to an embodiment of the present disclosure includes the solid-state imaging device according to the embodiment of the present disclosure described above.

In the solid-state imaging device and the solid-state imaging apparatus according to the embodiments of the present disclosure, the contact electrode is provided; therefore, the impurity diffusion regions provided for respective pixel regions adjacent to each other are electrically coupled to each other via the contact electrode.

According to the solid-state imaging device and the solid-state imaging apparatus according to the embodiments of the present disclosure, the contact electrode is provided, which makes it possible to share the impurity diffusion region among the pixel regions adjacent to each other. This makes it possible to share the impurity diffusion region among a plurality of pixel regions.

It is to be noted that the above-described contents are mere examples of the present disclosure. The effects of the present disclosure are not limited to the description above, and the effects of the present disclosure may be other effects, or may further include other effects.

BRIEF DESCRIPTION OF DRAWINGS

FIG. 15 is a functional block diagram illustrating an example of an electronic apparatus including the imaging device illustrated in FIG. 1 and the like.

MODES FOR CARRYING OUT THE INVENTION

In the following, some embodiments of the present disclosure are described in detail with reference to the accompanying drawings. It is to be noted that description is given in the following order.
1. Embodiment (a solid-state imaging device in which a contact electrode is disposed for every 2×2 pixel regions)
2. Modification Example 1 (an example including a contact electrode for every 2×1 pixel regions)
3. Modification Example 2 (an example in which an impurity diffusion region includes a plurality of regions having different concentrations)
4. Modification Example 3 (an example in which a source-drain region of a transistor is shared)
5. Application Example (an imaging apparatus)
6. Practical Application Examples

Embodiment (Configuration of Imaging Device 1)

Figure 1:
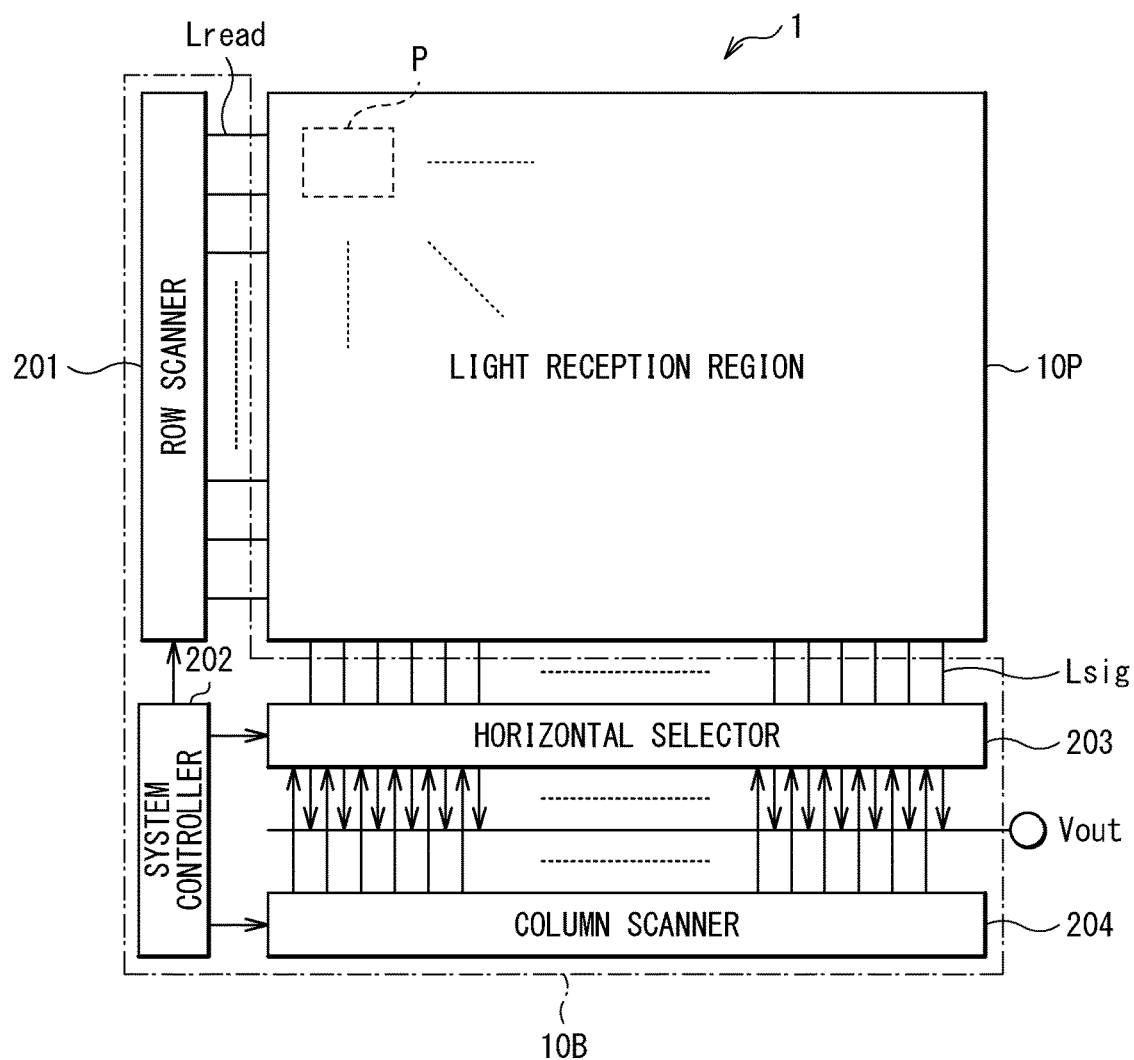
FIG. 1 is a schematic plan view of an entire configuration of an imaging device according to an embodiment of the present disclosure.

FIG. 1 schematically illustrates an example of a functional configuration of a solid-state imaging device (an imaging device 1) according to an embodiment of the present disclosure. The imaging device 1 has sensitivity to light of a wavelength in a visible region, for example. The imaging device 1 is provided with, for example, a quadrangular light reception region 10P and a peripheral region 10B located outside the light reception region 10P. The peripheral region 10B is provided with a peripheral circuit for driving the light reception region 10P.

The light reception region 10P of the imaging device 1 is provided with, for example, a plurality of readout unit regions (pixel regions P) that is two-dimensionally arranged. The peripheral circuit provided in the peripheral region 10B includes, for example, a row scanner 201, a horizontal selector 203, a column scanner 204, and a system controller 202.

For example, a pixel drive line Lread (for example, a row selection line and a reset control line) is wired with the pixel regions P of each pixel row, and a vertical signal line Lsig is wired with the pixel regions P of each pixel column. The pixel drive line Lread transmits a drive signal for signal reading from the pixel region P. One end of the pixel drive line Lread is coupled to an output terminal, corresponding to each row, of the row scanner 201.

The row scanner 201 is a pixel driver that includes a shift register, an address decoder, and the like, and drives each of the pixel regions P of the light reception region 10P, for example, on a row-by-row basis. A signal outputted from each of the pixel regions P of a pixel row selected and scanned by the row scanner 201 is supplied to the horizontal selector 203 through each of the vertical signal lines Lsig. The horizontal selector 203 includes an amplifier, a horizontal selection switch, and the like that are provided for each of the vertical signal lines Lsig.

The column scanner 204 includes a shift register, an address decoder, and the like, and sequentially drives respective horizontal selection switches of the horizontal selector 203 while scanning the horizontal selection switches. Through such selective scanning by the column scanner 204, signals of respective pixels transmitted through the respective vertical signal lines Lsig are sequentially outputted to a horizontal signal line 205, and are inputted to an unillustrated signal processor or the like through the horizontal signal line 205.

The system controller 202 receives a clock given from the outside or data instructing an operation mode, and the like, and outputs data such as internal information of the imaging device 1. The system controller 202 further includes a timing generator that generates various timing signals, and performs drive control of the row scanner 201, the horizontal selector 203, the column scanner 204, and the like on the basis of the various timing signals generated by the timing generator.

Figure 2:
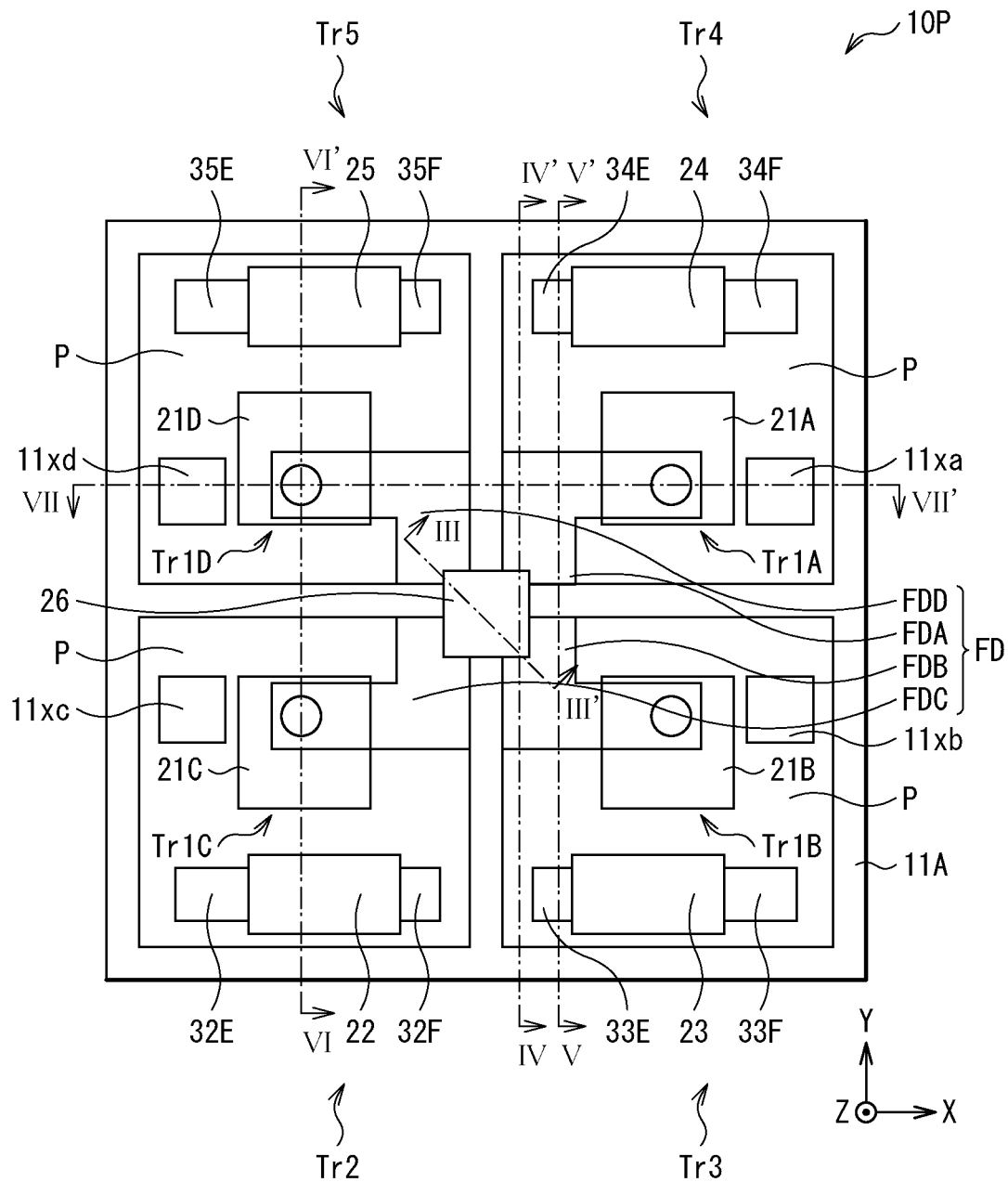
FIG. 2 is a schematic plan view of a configuration of a main part of a light reception region illustrated in FIG. 1.

FIG. 2 illustrates a schematic planar configuration of the light reception region 10P illustrated in FIG. 1. FIG. 3, FIG. 4, FIG. 5, FIG. 6, and FIG. 7 respectively illustrate a cross-sectional configuration taken along a line III-III' illustrated in FIG. 2, a cross-sectional configuration taken along a line IV-IV' illustrated in FIG. 2, a cross-sectional configuration taken along a line V-V' illustrated in FIG. 2, a cross-sectional configuration taken along a line VI-VI' illustrated in FIG. 2, and a cross-sectional configuration taken along a line VII-VII' illustrated in FIG. 2. FIG. 2 illustrates two rows×two columns, that is, four pixel regions P. The configuration of the imaging device 1 is described in detail below with reference to FIGS. 2 to 7.

The imaging device 1 includes a semiconductor substrate 11 having a first surface S1 (a front surface) and a second surface S2 (a back surface) opposed to each other, and a multilayer wiring layer 20 provided on the first surface S1 of the semiconductor substrate 11 (FIGS. 3 to 7). The imaging device 1 is an imaging device of a back-side illumination type, and the second surface S2 of the semiconductor substrate 11 serves as a light reception surface. The multilayer wiring layer 20 opposed to the semiconductor substrate 11 includes a plurality of wiring lines 20W and an interlayer insulating film 201. The imaging device 1 includes a color filter 14 and a microlens 15 on the second surface S2 of the semiconductor substrate 11 with an insulating film 13 interposed therebetween.

The semiconductor substrate 11 includes a pixel separation groove 11A between pixel regions P adjacent to each other (FIG. 2). In the semiconductor substrate 11, a PD (Photo Diode) 12 (a photoelectric converter) is provided for each of the pixel regions P (FIGS. 4 to 7).

The semiconductor substrate 11 includes p-type silicon (S1), for example. The pixel separation groove 11A extending in a thickness direction of the semiconductor substrate 11 (in a Z direction in FIGS. 3 to 7) has, for example, an FTI (Full Trench Isolation) structure, and is provided to penetrate from the first surface S1 to the second surface S2, for example. The pixel separation groove 11A has, for example, a grid planar shape, and is disposed to surround the pixel regions P. For example, an insulating film including silicon oxide (SiO), silicon nitride (SiN), or the like is embedded in the pixel separation groove 11A. For example, a multilayer film including a plurality of insulating films may be embedded in the pixel separation groove 11A. Alternatively, an insulating film and polycrystal silicon (Poly Si) may be embedded in this order in the pixel separation groove 11A. An insulating film and an air layer may be embedded in this order in the pixel separation groove 11A. For dark current suppression, a periphery of the pixel separation groove 11A is covered with a p-type diffusion layer, for example. Even if the pixel regions P become smaller, inflow of signal electric charges from pixel regions P adjacent to each other is suppressed by providing such a pixel separation groove 11A.

Transfer transistors Tr1A, Tr1B, Tr1C, and Tr1D, a reset transistor Tr2, an amplifier transistor Tr3, a select transistor Tr4, and a dummy transistor Tr5 are provided in proximity to the first surface S of the semiconductor substrate 11 (FIG. 2). Such transistors each include, for example, a MOSFET (Metal Oxide Semiconductor Field Effect Transistor).

Figure 6:
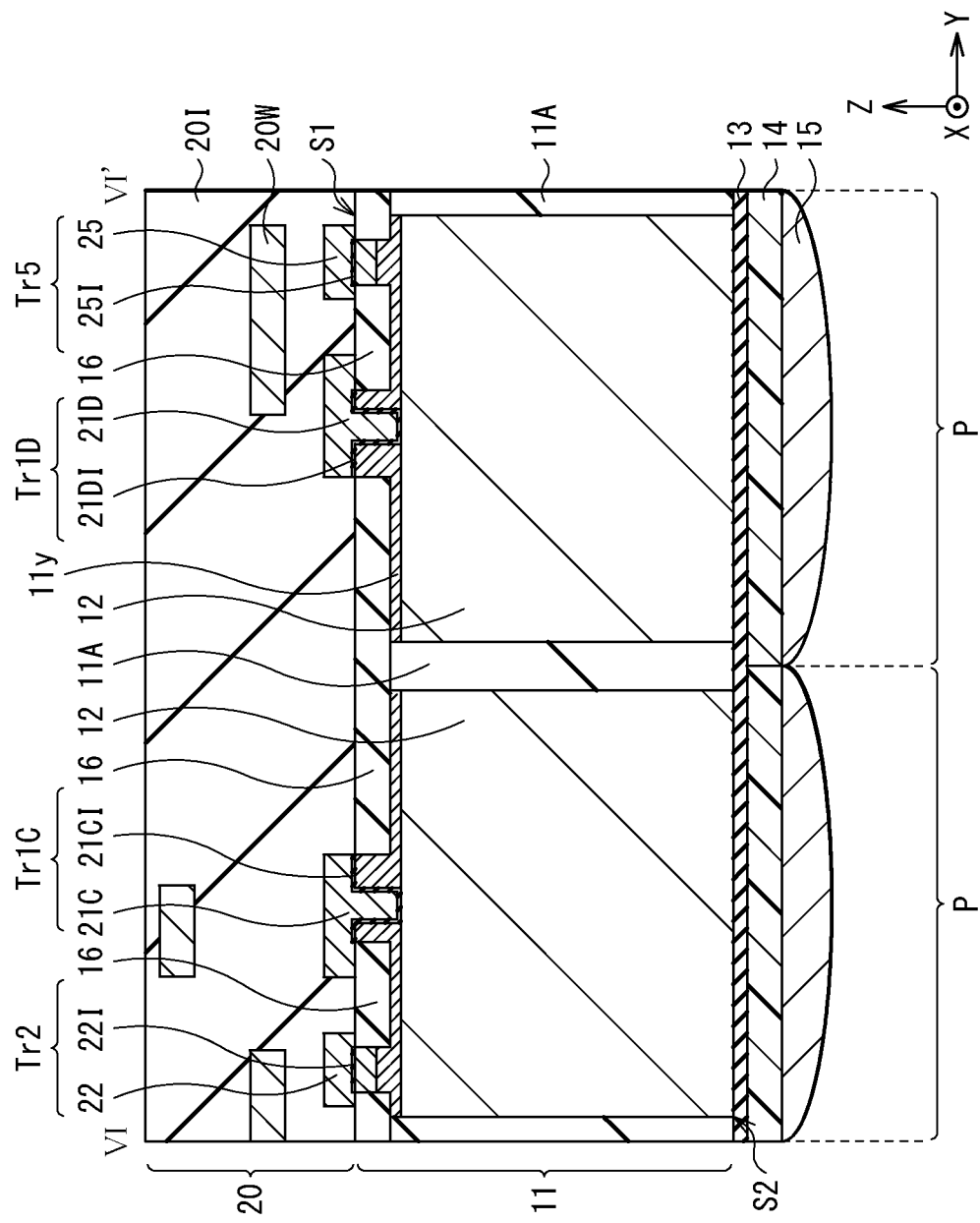
FIG. 6 is a schematic view of a cross-sectional configuration taken along a line VI-VI' illustrated in FIG. 2.
Figure 7:
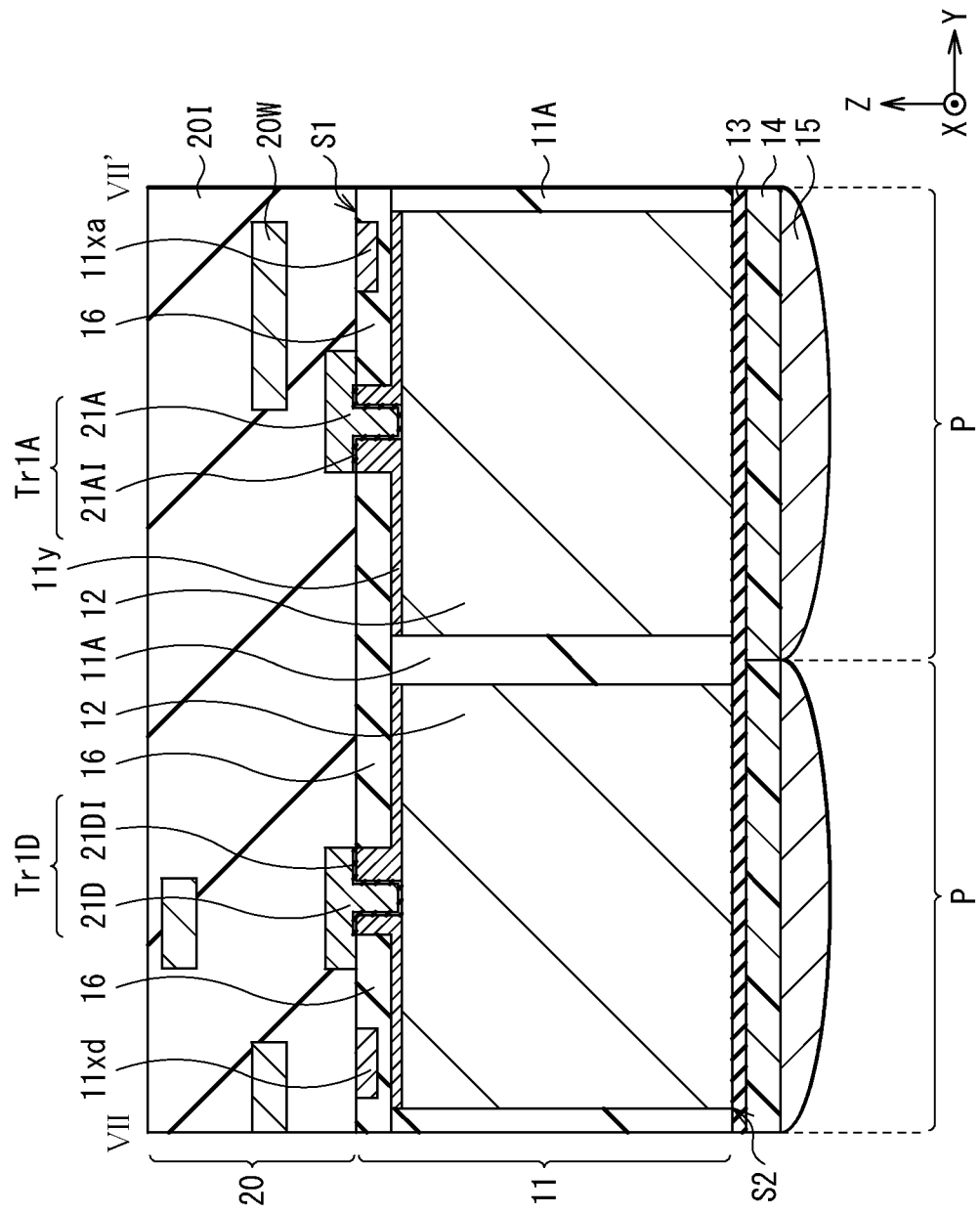
FIG. 7 is a schematic view of across-sectional configuration taken along a line VII-VII' illustrated in FIG. 2.

The transfer transistor Tr1A includes a gate electrode 21A, a gate insulating film 21 AI, and an FD (floating diffusion) A (FIGS. 2 and 7). The transfer transistor Tr1B includes agate electrode 21B, agate insulating film, and an FD B (FIG. 2). The transfer transistor Tr1C includes agate electrode 21C, agate insulating film 21CI, and an FD C. (FIGS. 2 and 6). The transfer transistor Tr1D includes a gate electrode 21D, a gate insulating film 21DI, and an FD D (FIGS. 2 and 6). As described later, in the imaging device 1, one contact electrode 26 is disposed for four pixel regions P of two rows×two columns. The FD A, the FD B, the FD C. and the FD D of the respective transfer transistors Tr1A, Tr1B, Tr1C, and Tr1D are electrically short-circuited to each other via the contact electrode 26. In other words, an FD (an electric charge accumulation section) shared among the four pixel regions P includes the FD A, the FD B, the FD C, and the FD D.

The reset transistor Tr2 includes a gate electrode 22, a gate insulating film 221, and a pair of source-drain regions 32E and 32F (FIGS. 2 and 6). The amplifier transistor Tr3 includes a gate electrode 23, a gate insulating film, and a pair of source-drain regions 33E and 33F (FIG. 2). The select transistor Tr4 includes a gate electrode 24, a gate insulating film, and a pair of source-drain regions 34E and 34F (FIG. 2). The dummy transistor Tr5 includes a gate electrode 25, a gate insulating film 251, and a pair of source-drain regions 35E and 35F (FIGS. 2 and 6). The reset transistor Tr2, the amplifier transistor Tr3, the select transistor Tr4, and the dummy transistor Tr5 are also shared among the four pixel regions P.

Figure 8:
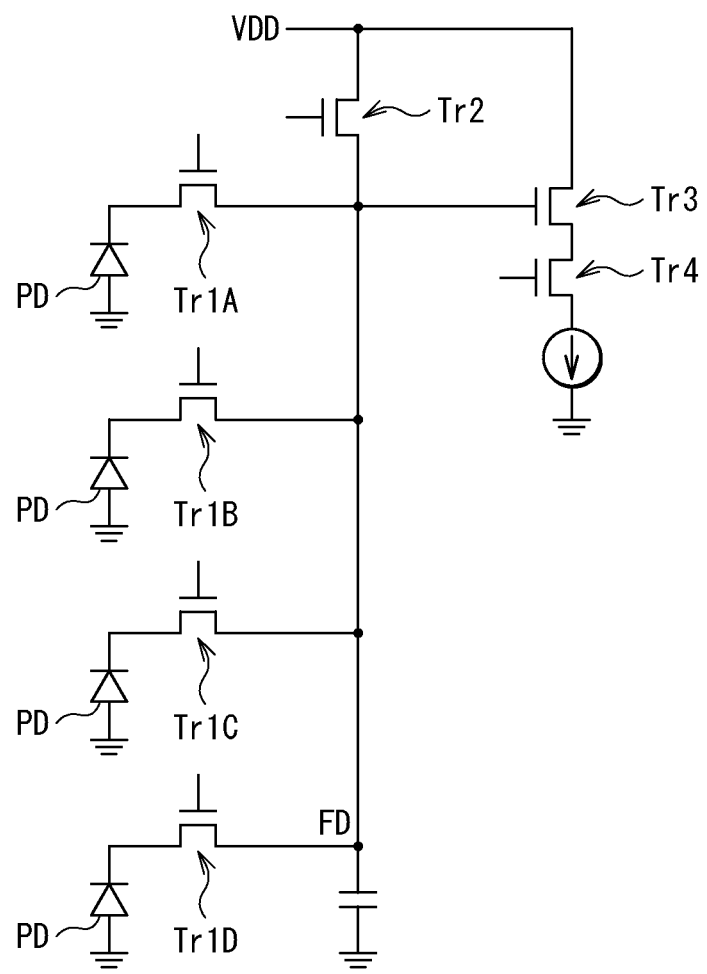
FIG. 8 is an equivalent circuit diagram illustrating an example of a configuration of a pixel region illustrated in FIG. 2.

FIG. 8 illustrates an example of an equivalent circuit diagram of the imaging device 1.

Each of the four pixel regions P is provided with any one of the transfer transistors Tr1A, Tr1B, Tr1C, and Tr1D. That is, one transfer transistor (anyone of the transfer transistors Tr1A, Tr1B, Tr1C, and Tr1D) is disposed in one pixel region P. The respective transfer transistors Tr1A, Tr1B, Tr1C, and Tr1D are coupled to different PDs 12. The transfer transistors Tr1A, Tr1B, Tr1C, and Tr1D each readout a signal electric charge generated by the PD 12 and transfers the signal electric charge to the FD (the FD A, the FD B, the FD C, or the FD D). The gate electrodes 21A, 21B, 21C, and 21D of the transfer transistors Tr1A, Tr1B, Tr1C, and Tr1D each have a columnar shape, for example, and are embedded in a groove of the semiconductor substrate 11 from the first surface S1 (the multilayer wiring layer 20) of the semiconductor substrate 11 (FIGS. 6 and 7). The gate insulating films (for example, the gate insulating films 21AI, 21CI, and 21D) of the transfer transistors Tr1A, Tr1B, Tr1C, and Tr1D are provided between the gate electrodes 21A, 21B, 21C, and 21D and the semiconductor substrate 11.

Figure 3:
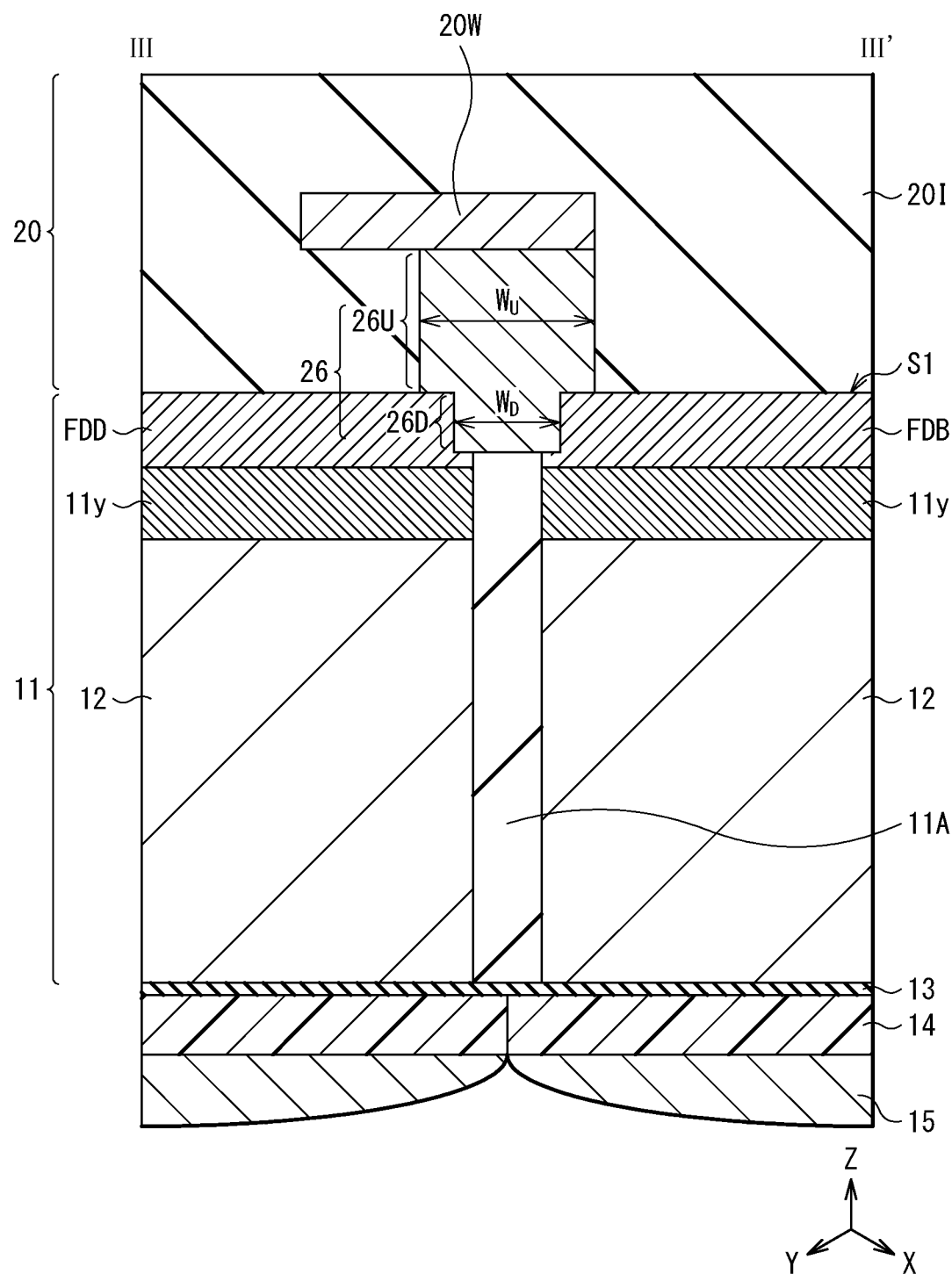
FIG. 3 is a schematic view of a cross-sectional configuration taken along a line III-III' illustrated in FIG. 2.
Figure 4:
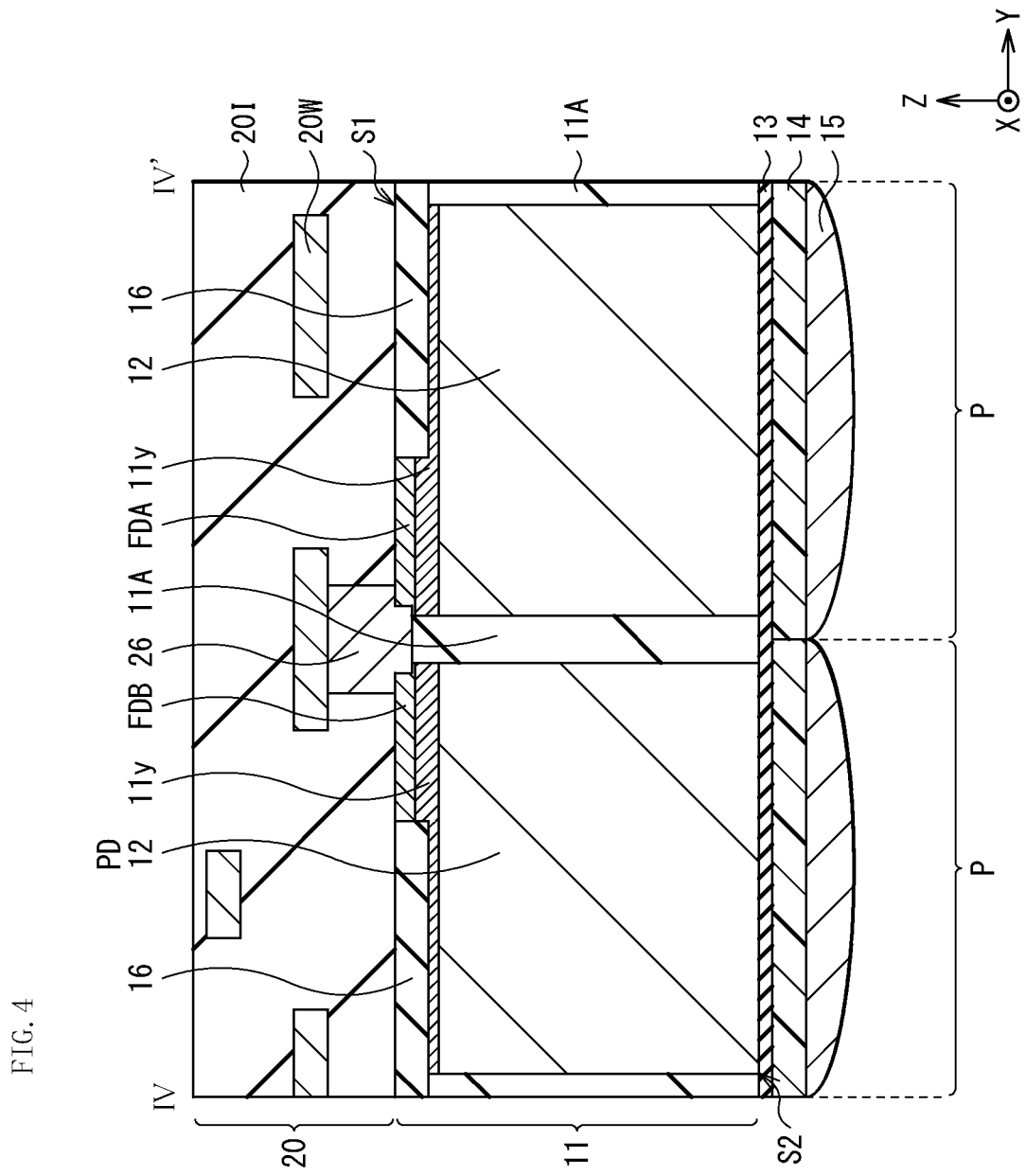
FIG. 4 is a schematic view of a cross-sectional configuration taken along a line IV-IV' illustrated in FIG. 2.
Figure 5:
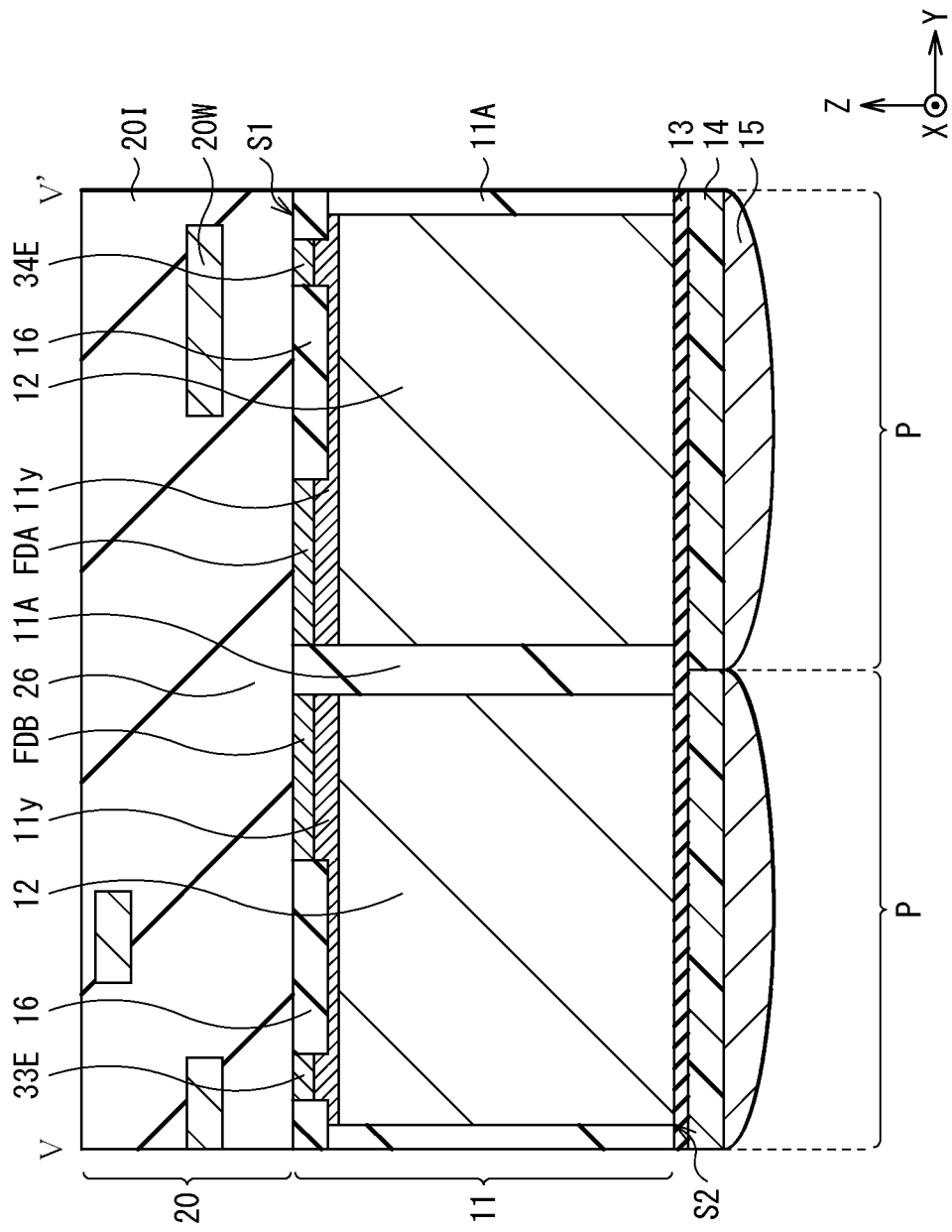
FIG. 5 is a schematic view of a cross-sectional configuration taken along a line V-V' illustrated in FIG. 2.

The FD A, the FD B, the FD C, and the FDD are provided in a middle portion of the four pixel regions P, and are disposed adjacent to each other (FIG. 2). The FD A is provided, for example, in an L-shape from a position overlapping the gate electrode 21A of the transfer transistor Tr1A toward the middle portion of the four pixel regions P in a plan (an XY plane in FIG. 2) view. The FD B is provided, for example, in an L-shape from a position overlapping the gate electrode 21B of the transfer transistor Tr1B toward the middle portion of the four pixel regions P in the plan view. The FD C is provided, for example, in an L shape from a position overlapping the gate electrode 21C of the transfer transistor Tr1C toward the middle portion of the four pixel regions P in the plan view. The FD D is provided, for example, in an L shape from a position overlapping the gate electrode 21D of the transfer transistor Tr1D toward the middle portion of the four pixel regions P in the plan view. The FD A, the FD B, the FD C, and the FD D are formed by diffusing an n-type impurity in a high concentration into a p-type well region 11y provided in proximity to the first surface S of the semiconductor substrate 11 (FIGS. 3 to 5). That is, the FD A, the FD B, the FD C, and the FD D each include an n-type impurity diffusion region provided in proximity to the first surface S1 of the semiconductor substrate 11.

In the present embodiment, the contact electrode 26 is provided over and in contact with the FD A, the FD B, the FD C, and the FD D. Accordingly, the FD A, the FD B, the FD C, and the FD D are electrically coupled to each other via the contact electrode 26 to have the same potential. This makes it possible to share the FD among the four pixel regions P. The contact electrode 26 is coupled to one (an n-type impurity diffusion region) of the pair of source-drain regions 32E and 32F of the reset transistor Tr2 and the gate electrode 23 of the amplifier transistor Tr3 via the wiring line 20W of the multilayer wiring layer 20 (FIG. 8).

The contact electrode 26 is provided in the middle portion of the four pixel regions P (FIG. 2). The contact electrode 26 is disposed at a position overlapping the pixel separation groove 1A in the plan view. The contact electrode 26 is embedded in the semiconductor substrate 11 from the first surface S1 of the semiconductor substrate 11, and is in contact with the FD A, the FD B, the FD C, and the FD D. A bottom surface and a portion of a side surface of the contact electrode 26 are in contact with the FD A, the FD B, the FD C, and the FD D.

The contact electrode 26 has, for example, an embedded portion 26D embedded in the semiconductor substrate 11, and an exposed portion 26U located outside the semiconductor substrate 11 (FIG. 3). The embedded portion 26D is in contact with the FD A, the FD B, the FD C, and the FD D, and the exposed portion 26U is provided in the multilayer wiring layer 20. For example, a width (a width $W_U$) of the exposed portion 26U is larger than a width (a width $W_D$) of the embedded portion 26D, and the exposed portion 26U may be provided to be widened from the embedded portion 26D (FIG. 3). As described in detail later, the contact electrode 26 has the embedded portion 26D, which results in an increase in a contact area between the contact electrode 26 and the FD A, the FD B, the FD C, and the FD D, and a reduction in contact resistance.

Figure 9:
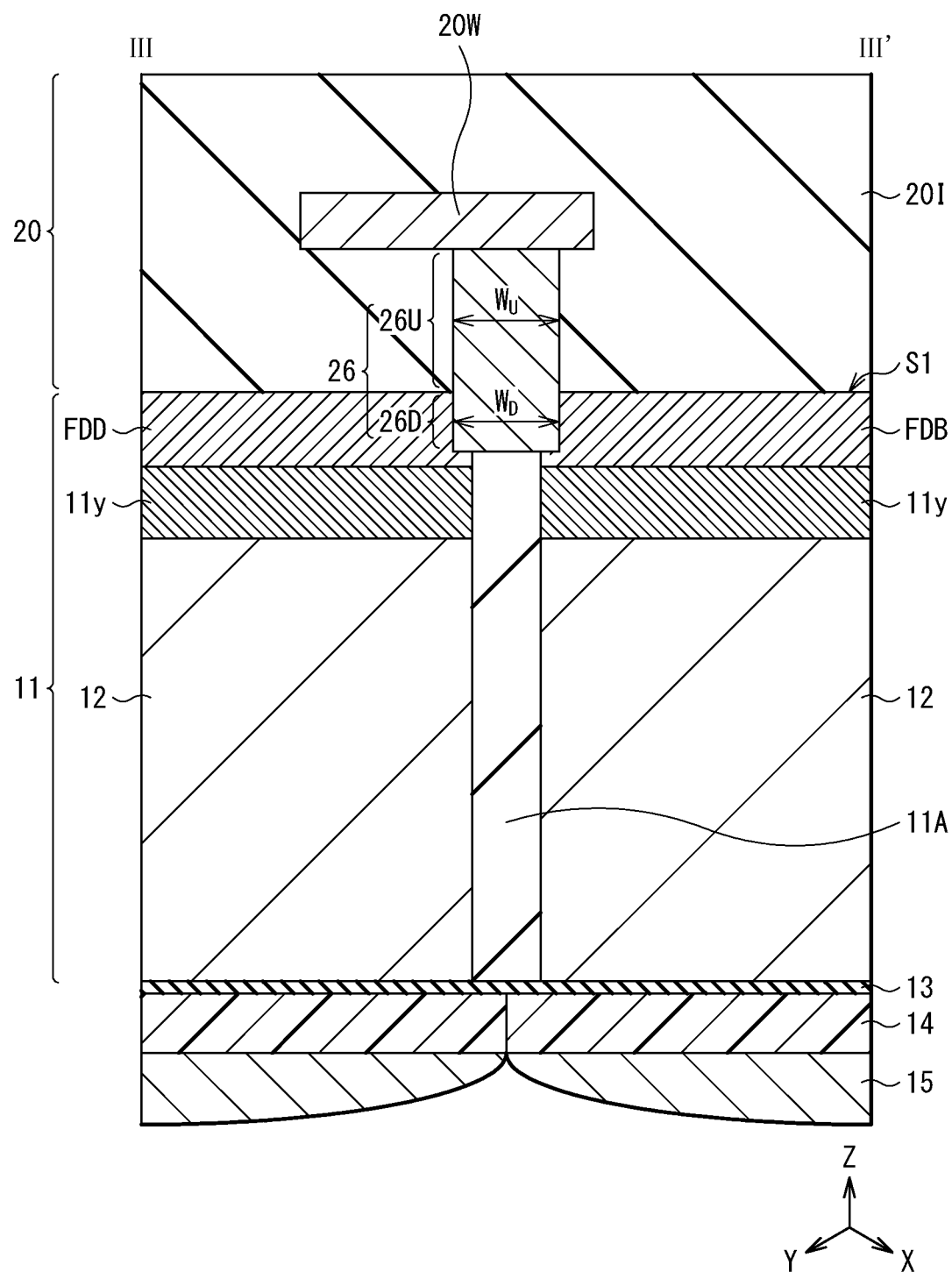
FIG. 9 is a schematic cross-sectional view of another example (1) of a configuration of a contact electrode illustrated in FIG. 4.

FIG. 9 illustrates another example of a configuration of the contact electrode 26. FIG. 9 corresponds to the cross-sectional configuration taken along the line III-III' of FIG. 2. The contact electrode 26 may have a substantially rectangular parallelepiped shape (FIG. 9). In the contact electrode 26, the width $W_U$ of the exposed portion 26U is equal to the width $W_D$ of the embedded portion 26D. It is possible to form such a contact electrode 26 easily.

Such a contact electrode 26 includes, for example, an electrically conductive metal material, and the like. Specifically, materials of the contact electrode 26 include simple substances or alloys of platinum (Pt), titanium (Ti), ruthenium (Ru), molybdenum (Mo), copper (Cu), tungsten (W), nickel (Ni), aluminum (Al), tantalum (Ta), and the like. The contact electrode 26 may have a single-layer configuration or a multilayer configuration.

The reset transistor Tr2 is disposed in the same pixel region P as the transfer transistor Tr1C (FIG. 2). The reset transistor Tr2 is provided at a position farther than the transfer transistor Tr1C from the middle portion of the four pixel regions P. The reset transistor Tr2 resets (eliminates) the signal electric charges held in the FD. The gate electrode 22 of the reset transistor Tr2 is opposed to a channel region, and is provided on the first surface S (the multilayer wiring layer 20) of the semiconductor substrate 11 (FIG. 6). One of the source-drain regions 32E and 32F of the reset transistor Tr2 is coupled to the FD, and the other one is coupled to a constant voltage source VDD (FIG. 8). The source-drain regions 32E and 32F of the reset transistor Tr2 are formed by diffusing an n-type impurity in a high concentration into the p-type well region 11y provided in proximity to the first surface S1 of the semiconductor substrate 11. That is, the source-drain regions 32E and 32F of the reset transistor Tr2 each include an n-type impurity diffusion region provided in proximity to the first surface S1 of the semiconductor substrate 11.

The amplifier transistor Tr3 is disposed in the same pixel region P as the transfer transistor Tr1B (FIG. 2). The amplifier transistor Tr3 is provided at a position farther than the transfer transistor Tr1B from the middle portion of the four pixel regions P. The amplifier transistor Tr3 amplifies the signal electric charge accumulated in the FD and outputs the amplified signal electric charge to the vertical signal line Lsig via the select transistor Tr4. The gate electrode 23 of the amplifier transistor Tr3 is opposed to a channel region, and is provided on the first surface S (the multilayer wiring layer 20) of the semiconductor substrate 11. The gate electrode 23 of the amplifier transistor Tr3 is coupled to the FD (FIG. 8). One of the pair of source-drain regions 33E and 33F of the amplifier transistor Tr3 is coupled to the constant voltage source VDD, and the other one is coupled to the select transistor Tr4. The source-drain regions 33E and 33F of the amplifier transistor Tr3 are formed by diffusing an n-type impurity in a high concentration into the p-type well region 11y provided in proximity to the first surface S1 of the semiconductor substrate 11. That is, the source-drain regions 33E and 33F of the amplifier transistor Tr3 each include an n-type impurity diffusion region provided in proximity to the first surface S1 of the semiconductor substrate 11.

The select transistor Tr4 is disposed in the same pixel region P as the transfer transistor Tr1A (FIG. 2). The select transistor Tr4 is provided at a position farther than the transfer transistor Tr1A from the middle portion of the four pixel region P. The select transistor Tr4 is provided between the amplifier transistor Tr3 and the vertical signal line Lsig (FIG. 8). In a case where an address signal is inputted to the gate electrode 24 of the select transistor Tr4, the select transistor Tr4 is turned on to output the signal electric charge amplified by the amplifier transistor Tr3 to the vertical signal line Lsig. The gate electrode 24 of the select transistor Tr4 is opposed to a channel region, and is provided on the first surface S1 (the multilayer wiring layer 20) of the semiconductor substrate 11. One of the pair of the source-drain regions 34E and 34F of the select transistor Tr4 is coupled to one of the source-drain regions 33E and 33F of the amplifier transistor Tr3, and the other one is coupled to the vertical signal line Lsig. The source-drain regions 34E and 34F of the select transistor Tr4 are formed by diffusing an n-type impurity in a high concentration into the p-type well region 11y provided in proximity to the first surface S1 of the semiconductor substrate 11. That is, the source-drain regions 34E and 34F of the select transistor Tr4 each include an n-type impurity diffusion region provided in proximity to the first surface S of the semiconductor substrate 11.

The dummy transistor Tr5 is disposed in the same pixel region P as the transfer transistor Tr1D. The dummy transistor Tr5 is provided at a position farther than the transfer transistor Tr1D from the middle portion of the four pixel regions P. The gate electrode 25, a channel region, and the pair of source-drain regions 35E and 35F of the dummy transistor Tr5 respectively have configurations similar to those of the gate electrodes 22, 23, and 24, the channel regions, and the pairs of source-drain regions 32E, 32F, 33E, 33F, 33E and 33F of the reset transistor Tr2, the amplifier transistor Tr3, and the select transistor Tr4.

The semiconductor substrate 11 includes a device separation film 16 in proximity to the first surface S1. The device separation film 16 is embedded in the first surface S1 of the semiconductor substrate 11, and is provided around the transfer transistors Tr1A, Tr1B, Tr1C, and Tr1D, the reset transistor Tr2, the amplifier transistor Tr3, the select transistor Tr4, and the dummy transistor Tr5. Adjacent transistors are electrically separated from each other by the device separation film 16. The device separation film 16 includes, for example, an insulating material such as silicon oxide (SiO) and TEOS (Tetra Ethyl Ortho Silicate).

In the semiconductor substrate 11, the PD 12 is provided for each of the pixel regions P. The PD12 includes, for example, an n-type impurity diffusion region formed in the thickness direction of the semiconductor substrate 11 (in the Z direction). The PD 12 has, for example, pn junction with the p-type well region 11y provided in proximity to the first surface S1 of the semiconductor substrate 11 and a p-type diffusion layer around the pixel separation groove 11A. That is, the PD 12 is a so-called pn junction type photodiode.

A p-type impurity diffusion region (diffusion regions 11xa, 11xb, 11xc, and 11xd) is provided for each of the pixel regions Pin proximity to the first surface S1 of the semiconductor substrate 11 (FIGS. 2 and 7). The diffusion regions 11xa, 11xb, 11xc, and 11xd each function as a GND (ground) terminal, and an unnecessary electric charge generated in the PD 12 is discharged via the diffusion region 11xa, 11xb, 11xc, or 11xd.

The multilayer wiring layer 20 stacked on the semiconductor substrate 11 is in contact with the first surface S of the semiconductor substrate 11. The plurality of wiring lines 20W included in the multilayer wiring layer 20 configures, for example, the pixel drive lines Lread, the vertical signal lines Lsig, and the like. The interlayer insulating film 201 includes, for example, silicon oxide (SiO), or the like.

The insulating film 13 covering the second surface S2 of the semiconductor substrate 11 has a function of planarizing the second surface S2, for example. The insulating film 13 includes, for example, silicon nitride (SiN), silicon oxide (SiO), silicon oxynitride (SiON), or the like. The insulating film 13 may have a single-layer configuration or a multilayer configuration. The insulating film 13 may include an antireflective film or a fixed electric charge film. It is possible to use, for example, a high-dielectric material having negative fixed electric charges for the fixed electric charge film. The fixed electric charge film includes, for example, hafnium oxide (Hf), aluminum oxide (AlO), a zirconium oxide (ZrO) film, tantalum oxide (TaO), titanium oxide (TiO), a stacked film thereof, or the like. The antireflective film includes, for example, titanium nitride (TiN), silicon nitride, silicon oxynitride, or the like.

The second surface S2 of the semiconductor substrate 11 is covered with the color filter 14 with the insulating film 13 interposed therebetween. The color filter 14 is, for example, one of a red (R) filter, a green (G) filter, a blue (B) filter, and a white filter (W), and is provided for each of the pixel regions P, for example. These color filters 14 are provided in a regular color arrangement (for example, a Bayer arrangement). Providing such color filters 14 allows the imaging device 1 to acquire color light reception data corresponding to the color arrangement.

The microlens 15 on the color filter 14 is provided at a position opposed to the PD 12 in each of the pixel regions P. Light having entered the microlens 15 is concentrated on the PD 12 in each of the pixel regions P. A lens system of the microlens 15 is set at a value corresponding to a size of the pixel region P. Examples of lens materials of the microlens 15 include an organic material, a silicon oxide film (SiO), and the like.

(Operation of Imaging Device 1)

In such an imaging device 1, for example, signal electric charges are acquired as follows. In a case where light enters the second surface S2 of the semiconductor substrate 11 via the microlens 15, the color filter 14, and the like, the light is detected (absorbed) by the PD 12 of each of the pixel region P, and color light of red, green, or blue is photoelectrically converted. Of a pair of an electron and a hole, one (for example, the electron) is moved to and accumulated in the FD (an n-type impurity diffusion region), and the other one (for example, the hole) is discharged to a ground potential GND via the p-type impurity diffusion region 11xa, 11xb, 11xc, or 11xd.

(Workings and Effects of Imaging Device 1)

In the imaging device 1 according to the present embodiment, the contact electrode 26 is provided in contact with the FD A, the FD B, the FD C, and FD D that are provided in four pixel regions P adjacent to each other of two rows×two columns. This causes the FD A, the FD B, the FD C. and the FD D to have the same potential, and the FD is shared among the four pixel regions P adjacent to each other. This makes it easy to downsize each of the pixel regions P. This consequently makes it possible to miniaturize the pixel regions P.

In addition, the contact electrode 26 is embedded in the semiconductor substrate 11 (has the embedded portion 26D) to be in contact with four impurity diffusion regions (the FD A, the FD B, the FD C, and FD D). Accordingly, a wiring line for coupling respective impurity regions to each other is not necessary, which makes it possible to simplify the configuration of the wiring line. The workings and the effects are described below with use of a comparative example.

Figure 10A:
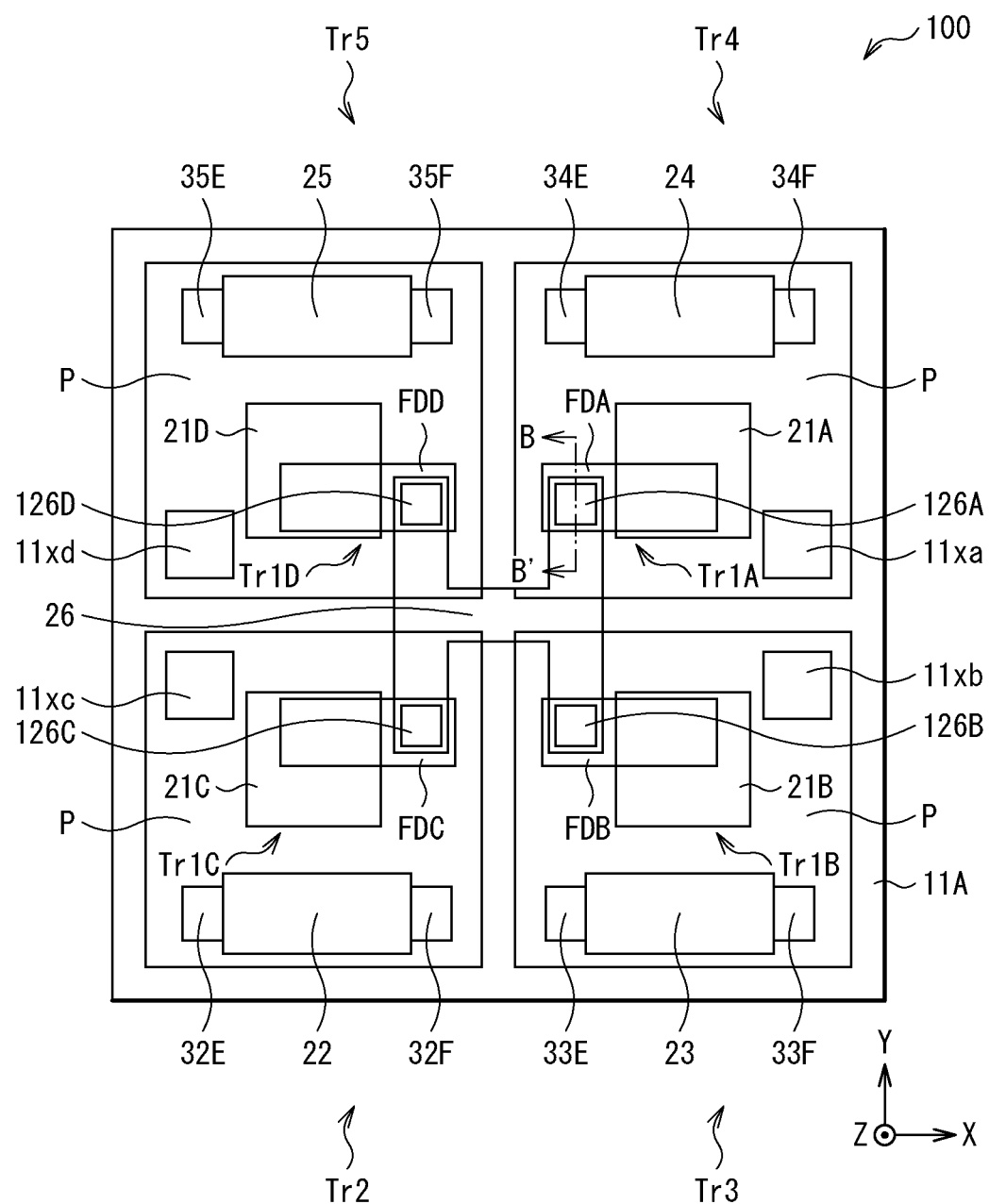
FIG. 10A is a schematic plan view of a configuration of a main part of an imaging device according to a comparative example.
Figure 10B:
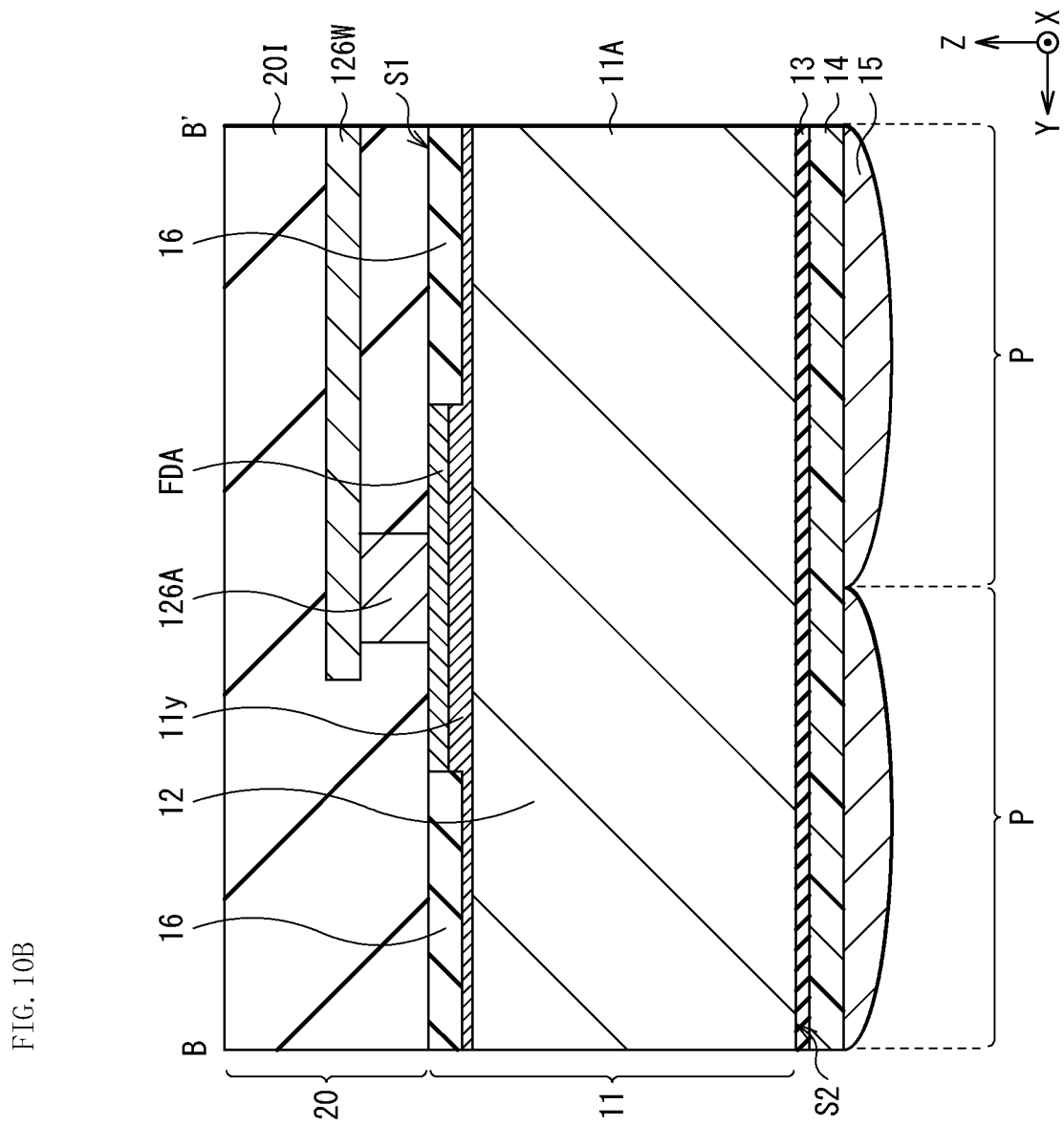
FIG. 10B is a schematic view of a cross-sectional configuration taken along a line B-B' illustrated in FIG. 10A.

FIGS. 10A and 10B illustrate a configuration of a light reception region of an imaging device (an imaging device 100) according to a comparative example. FIG. 10A illustrates a schematic planar configuration of the imaging device 100, and FIG. 10B illustrates a schematic cross-sectional configuration taken along a line B-B' of FIG. 10B. The imaging device 100 includes the pixel separation groove 11A between pixel regions P adjacent to each other. In the imaging device 100, the FD, the reset transistor Tr2, the amplifier transistor Tr3, the select transistor Tr4, and the dummy transistor Tr5 are shared among four pixel regions P of two rows×two columns.

In the imaging device 100, contact electrodes (contact electrodes 126A, 126B, 126C, and 126D) are provided for the respective pixel regions P. The contact electrode 126A, the contact electrode 126B, the contact electrode 126C, and the contact electrode 126D are respectively in contact with the FD A, the FD B, the FD C, and the FD D. The pixel separation groove 11A that penetrates through the semiconductor substrate 11 is provided between the pixel regions P adjacent to each other; therefore, in the imaging device 100, the contact electrodes 126A, 126B, 126C, and 126D are coupled to each other by a wiring line (a wiring line 126W). The FD A, the FD B, the FD C, and the FD D are electrically coupled to each other by the contact electrodes 126A, 126B, 126C, and 126D, and the wiring line 126W.

In such an imaging device 100, the FD is shared among a plurality of pixel regions P by the wiring line 126W, which complicates the configuration of the wiring line 126W, thereby making it difficult to miniaturize the pixel regions P.

In contrast, in the present embodiment, one contact electrode 26 is provided over the impurity diffusion regions (the FD A, the FD B, the FD C, and the FD D) provided for the respective four pixel regions P. Accordingly, a wiring line (the wiring line 126W of the imaging device 100) is not necessary, which makes it possible to simplify the configuration of wiring line. This makes it possible to miniaturize the pixel regions P.

As described above, in the imaging device 1 according to the present embodiment, the contact electrode 26 is provided, which makes it possible to share the FD among the pixel regions P adjacent to each other. This make it possible to share the FD among a plurality of pixel regions P.

In addition, one contact electrode 26 is provided over and in contact with the FD A, the FD B, the FD C, and the FD D; therefore, even if the pixel separation groove 11A is provided between the pixel regions P adjacent to each other, it is possible to simplify the configuration of the wiring line. This makes it possible to suppress inflow of signal electric charges from the pixel regions P adjacent to each other and to miniaturize the pixel regions P.

Further, the contact electrode 26 is embedded in the semiconductor substrate 11, which makes it possible to increase the contact area between the contact electrode 26 and the FD A, the FD B, the FD C, and the FD D, and to reduce contact resistance. In other words, it is possible to obtain necessary contact resistance by the smaller contact electrode 26. This makes it possible to miniaturize the pixel regions P.

The following describes modification examples of the embodiment described above, and in the following description, the same components as those of the embodiment described above are denoted by the same reference numerals, and description thereof is omitted as appropriate.

Modification Example 1

Figure 11A:
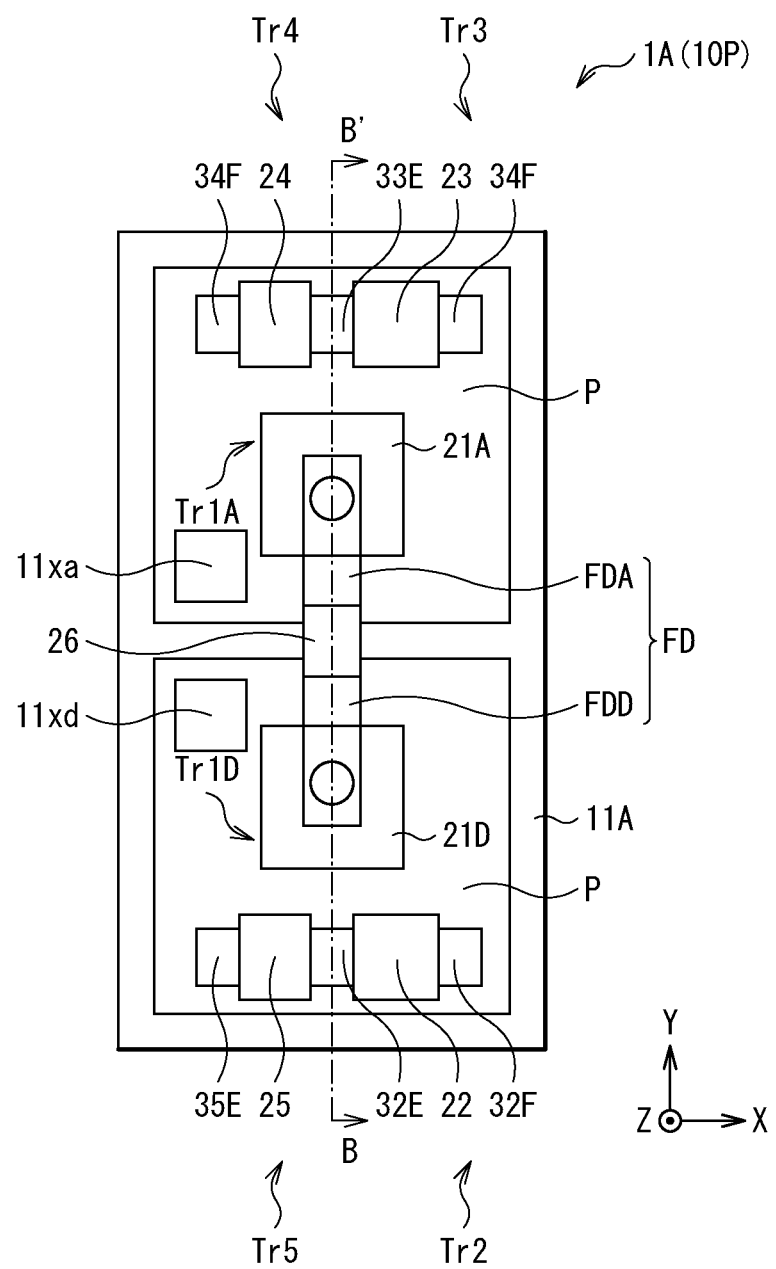
FIG. 11A is a schematic plan view of a configuration of a main part of an imaging device according to a modification example 1.
Figure 11B:
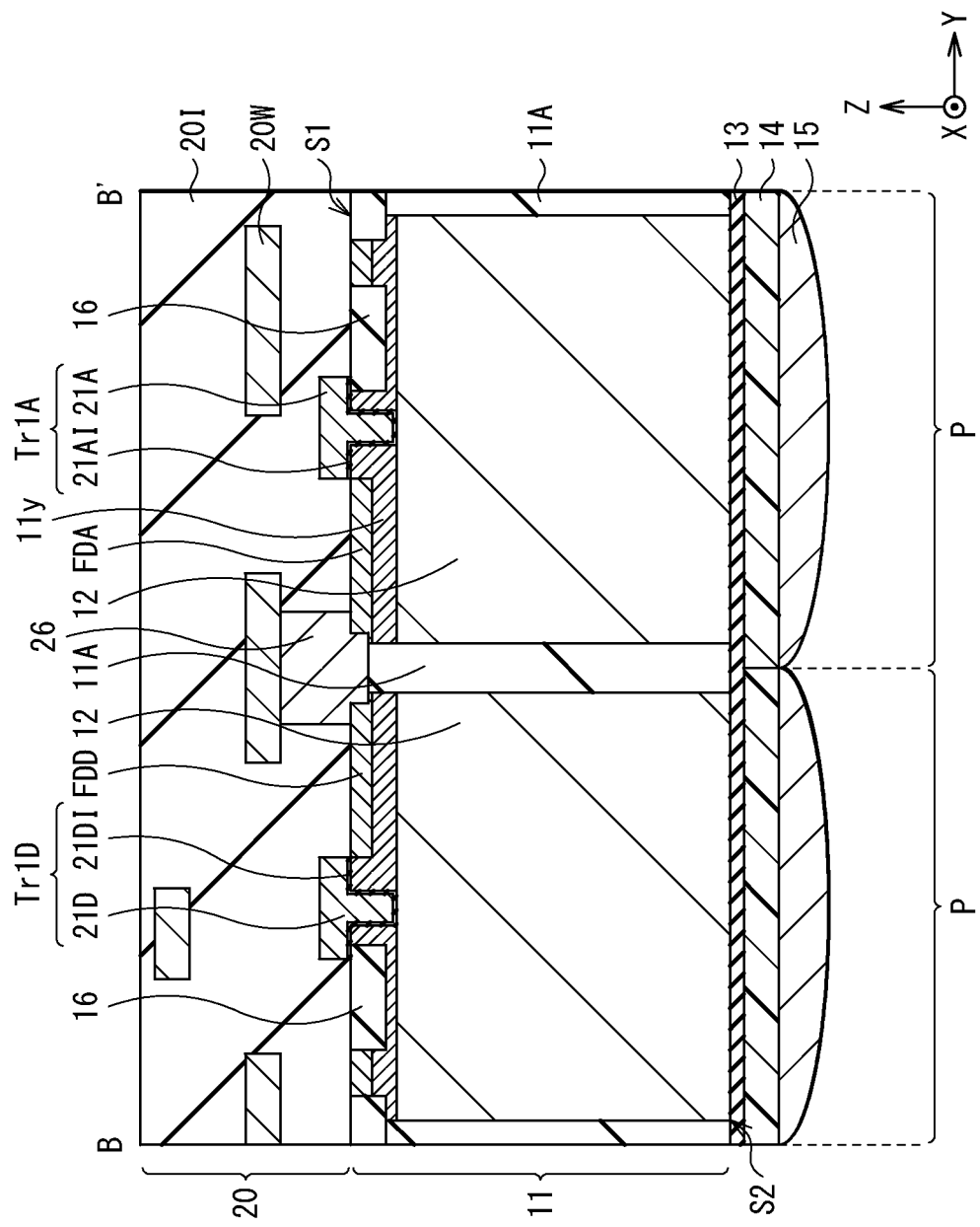
FIG. 11B is a schematic view of a cross-sectional configuration taken along a line B-B' illustrated in FIG. 11A.

FIGS. 11A and 11B schematically illustrate a configuration of a main part of an imaging device (an imaging device 1A) according to a modification example 1 of the embodiment described above. FIG. 11A illustrates a planar configuration of the light reception region 10P, and FIG. 11B illustrates a cross-sectional configuration taken along a line B-B' illustrated in FIG. 11A. In the imaging device 1A, the FD is shared between two pixel regions P of two rows×one column. Except for this point, the imaging device 1A has a configuration similar to that of the imaging device 1 according to the embodiment described above, and workings and effects thereof are also similar.

In the imaging device 1A, for example, the pixel region P in which the transfer transistor Tr1A is disposed and the pixel region P in which the transfer transistor Tr1D is disposed are disposed adjacent to each other in a column direction. The FD A of the transfer transistor Tr1A is provided at a position adjacent to the FD D of the transfer transistor Tr1D. In the imaging device 1A, the contact electrode 26 is provided in contact with the FD A and the FD D.

The contact electrode 26 is disposed at a position overlapping the pixel separation groove 11A in a plan view, and is embedded in the semiconductor substrate 11 from the first surface S1 of the semiconductor substrate 11.

In the imaging device 1A, the contact electrode 26 is provided over the impurity diffusion regions (the FD A and the FD D) provided for the respective two pixel regions P, which makes it possible to share the FD between the two pixel regions P adjacent to each other. FIGS. 12A and 12B illustrate an example in which the contact electrode 26 is provided between the two pixel regions P of two rows×one column; however, the contact electrode 26 may be provided between two pixel regions P of one row×two columns.

Modification Example 2

Figure 12:
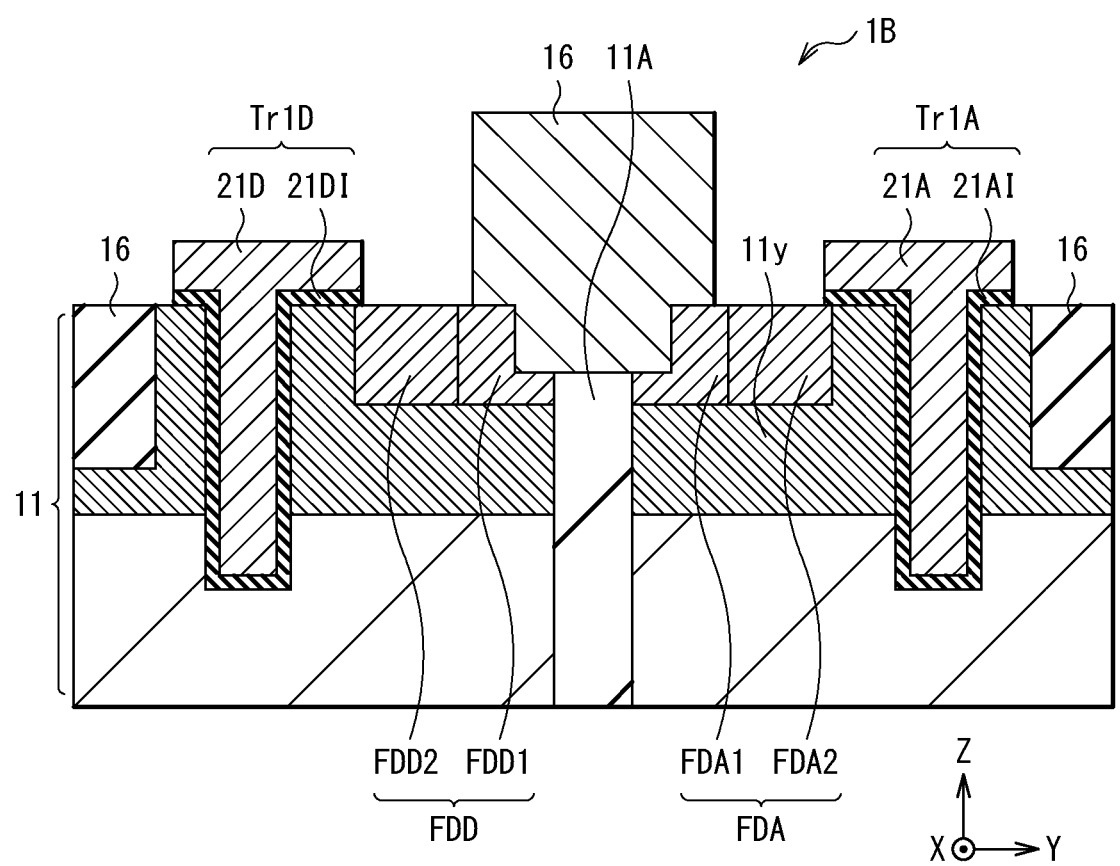
FIG. 12 is a schematic cross-sectional view of a configuration of a main part of an imaging device according to a modification example 2.

FIG. 12 schematically illustrates a cross-sectional configuration of a main part of an imaging device (an imaging device 1B) according to a modification example 2 of the embodiment described above. In the imaging device 1B, each of the FD A and the FD D in contact with the contact electrode 26 has regions (an FD A1, an FD A2, an FD D1, and an FD D2) having different impurity concentrations. Except for this point, the imaging device 1B has a configuration similar to that of the imaging device 1 according to the embodiment described above, and workings and effects thereof are also similar.

In the imaging device 1B, for example, as with the modification example 1 described above, the FD is shared between two pixel regions P of two rows×one column, and the contact electrode 26 is in contact with the FD A and the FD D. Here, the FD A includes the FD A1 (a first impurity diffusion region) in contact with the contact electrode 26, and the FD A2 (a second impurity diffusion region) provided at a position further than the FD A1 from the contact electrode 26, and the FD D includes the FD D1 (a first impurity diffusion region) in contact with the contact electrode 26, and the FD D2 (a second impurity diffusion region) provided at a position farther than the FD D1 from the contact electrode 26. That is, the FD A2 and the FD D2 are disposed outside of the FD A1 and the FD D from the contact electrode 26 as a center. The impurity concentration of the FD A2 is lower than the impurity concentration of the FD A1, and the impurity concentration of the FD D2 is lower than the impurity concentration of the FD D1.

In the imaging device 1B, the FD D2 and the FD D2 respectively having impurity concentrations lower than the impurity concentrations of the FD A1 and the FD D1 are provided outside the FD A1 and the FD D in contact with the contact electrode 26, which makes it possible to suppress parasitic capacitance resulting from the impurity diffusion regions while reducing contact resistance. FIG. 12 illustrates an example in which the FD is shared between two pixel regions P of two rows×one column; however, in a case where the FD is shared among four pixel regions P of two rows×two columns, regions having different impurity concentrations may be provided in the FD (for example, the FD A, the FD B, the FD C, and the FD D).

Modification Example 3

Figure 13A:
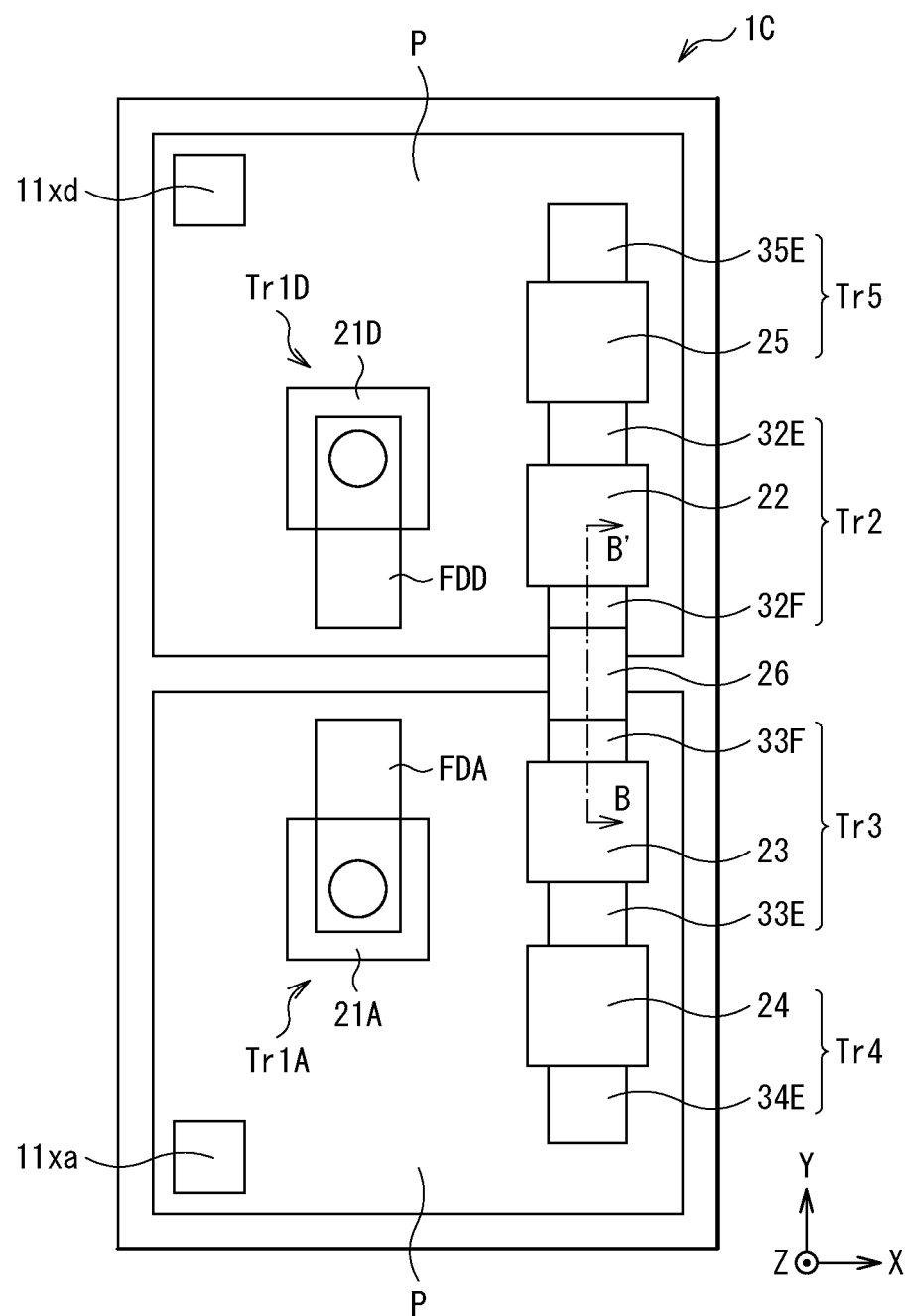
FIG. 13A is a schematic plan view of a configuration of a main part of an imaging device according to a modification example 3.
Figure 13B:
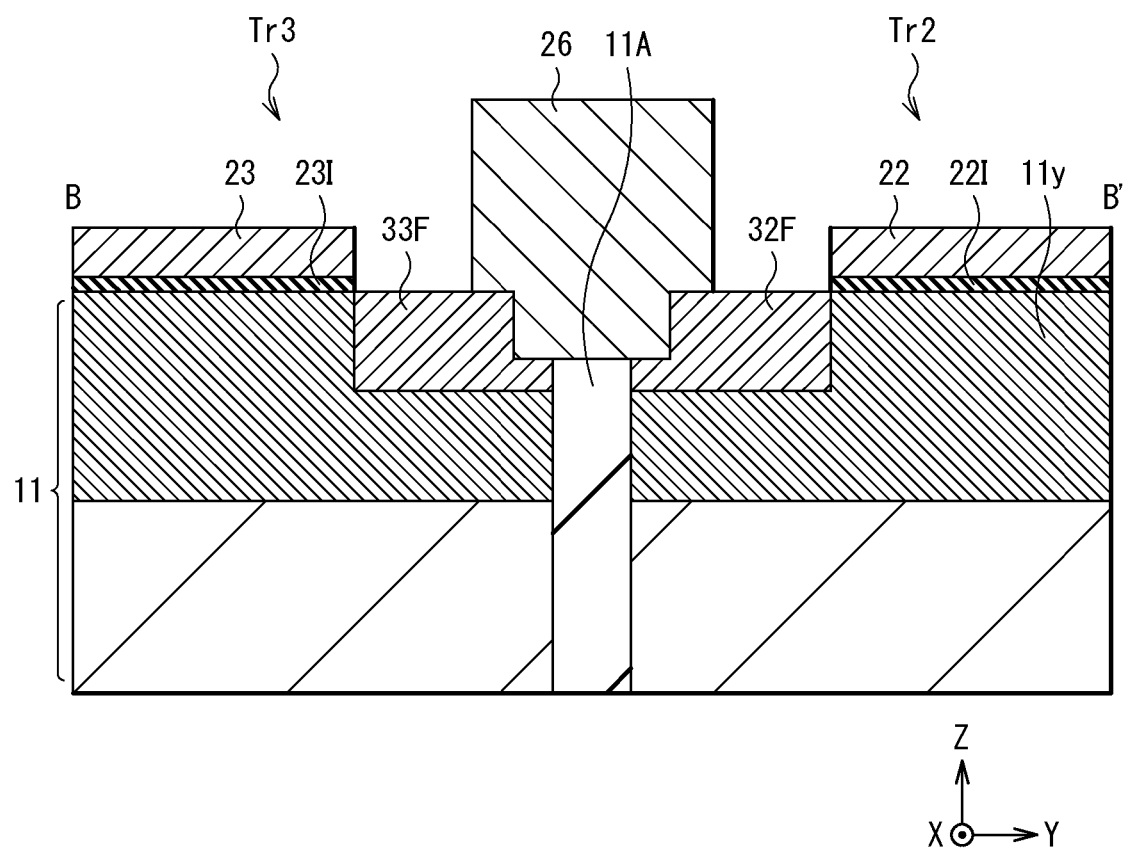
FIG. 13B is a schematic view of a cross-sectional configuration taken along a line B-B' illustrated in FIG. 13A.

FIGS. 13A and 13B schematically illustrate a configuration of a main part of an imaging device (an imaging device 1C) according to a modification example 3 of the embodiment described above. FIG. 13A illustrates a planar configuration of the light reception region 10P, and FIG. 13B illustrates a cross-sectional configuration taken along a line B-B' illustrated in FIG. 13A. In the imaging device 1C, a constant voltage source VDD terminal (the source-drain region 32F) of the reset transistor Tr2, and a constant voltage source VDD terminal (the source-drain region 33F) of the amplifier transistor Tr3 are shared between two pixel regions P of two rows×one column. Except for this point, the imaging device 1C has a configuration similar to that of the imaging device 1 according to the embodiment described above, and workings and effects thereof are also similar.

In the imaging device 1C, the reset transistor Tr2, the amplifier transistor Tr3, the select transistor Tr4, and the dummy transistor Tr5 are shared between two pixel regions adjacent to each other in the column direction, for example. For example, of the two pixel regions P, one pixel region P (on an upper side of a paper surface in FIG. 13A) is provided with the transfer transistor Tr1D, the reset transistor Tr2, and the dummy transistor Tr5, and the other pixel region P (on a lower side of the paper surface in FIG. 13A) is provided with the transfer transistor Tr1A, the amplifier transistor Tr3, and the select transistor Tr4. The reset transistor Tr2 and the amplifier transistor Tr3 are disposed adjacent to each other between these two pixel regions P.

As described in the embodiment above, the pair of source-drain regions 32E and 32F of the reset transistor Tr2 and the pair of source-drain regions 33E and 33F of the amplifier transistor Tr3 each include the n-type impurity diffusion region. For example, the source-drain region 32F of the reset transistor Tr2 and the source-drain region 33F of the amplifier transistor Tr3 are provided at adjacent positions. In the imaging device 1C, the contact electrode 26 is provided in contact with the source-drain region 32F and the source-drain region 33F.

The contact electrode 26 is disposed at a position overlapping the pixel separation groove 11A in a plan view, and is embedded in the semiconductor substrate 11 from the first surface S1 of the semiconductor substrate 11. The contact electrode 26 is coupled to the constant voltage source VDD via the wiring line 20W (FIG. 3 and the like) of the multilayer wiring layer 20, for example.

In the imaging device 1C, the contact electrode 26 is provided over the impurity diffusion regions (the source-drain regions 32F and 33F) provided for the respective two pixel regions P, which makes it possible to share the constant voltage source VDD terminal between the two pixel regions P adjacent to each other. FIGS. 13A and 13B illustrate an example in which the contact electrode 26 is provided between the two pixel regions P of two rows×one column; however, the contact electrode 26 may be provided between two pixel regions P of one row×two columns.

Figure 14:
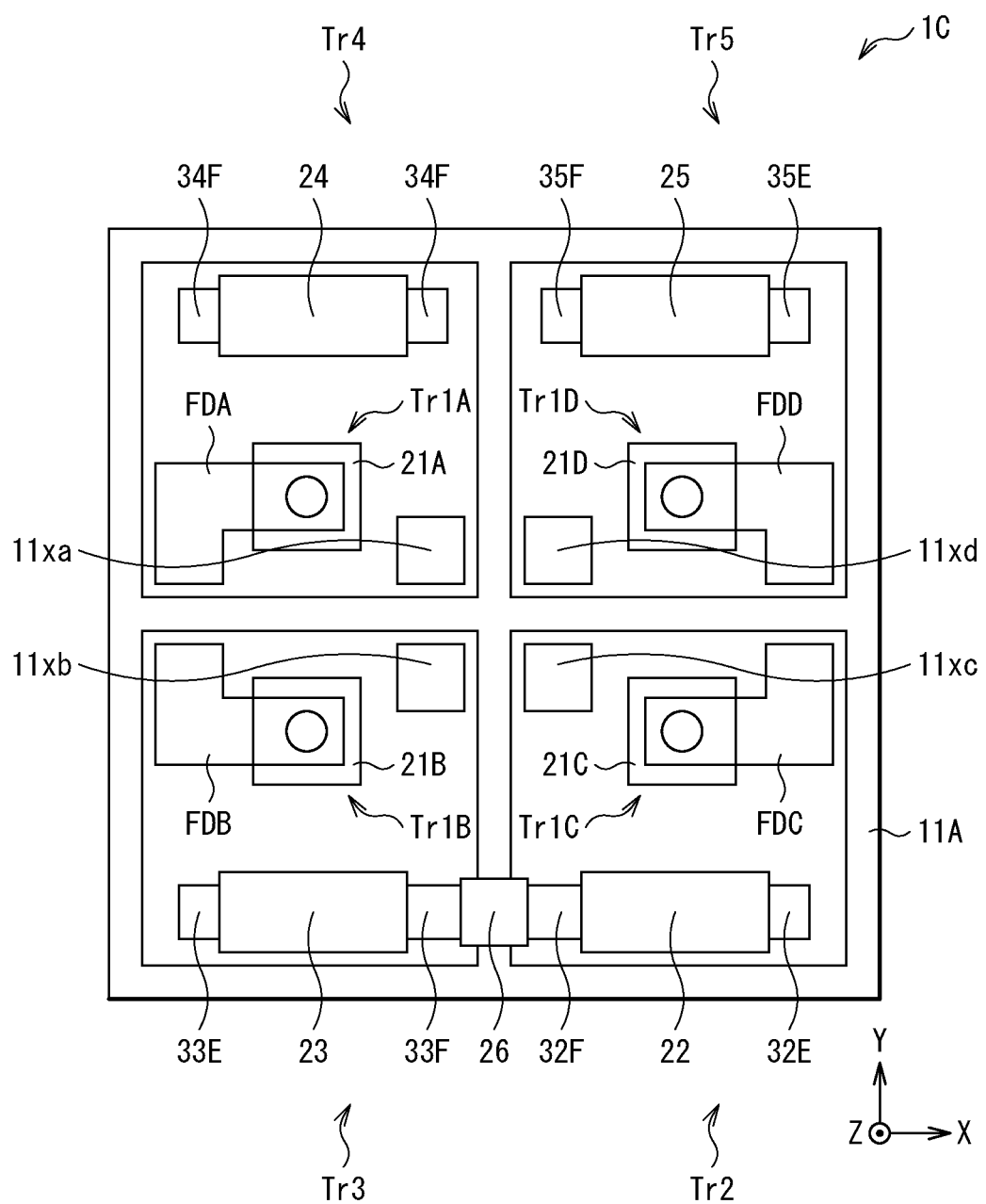
FIG. 14 is a schematic plan view of another example of the imaging device illustrated in FIG. 13A.

FIG. 14 illustrates another example of the configuration of the imaging device 1C. In the imaging device 1C, the reset transistor Tr2, the amplifier transistor Tr3, the select transistor Tr4, and the dummy transistor Tr5 are shared among four pixel regions of two rows×two columns. The constant voltage source VDD terminal (the source-drain region 32F) of the reset transistor Tr2 and the constant voltage source VDD terminal (the source-drain region 33F) of the amplifier transistor Tr3 may be shared.

For example, in the imaging device 1C, the reset transistor Tr2 and the amplifier transistor Tr3 are disposed adjacent to each other between the two pixel regions P adjacent to each other in a row direction. For example, the source-drain region 32F of the reset transistor Tr2 and the source-drain region 33F of the amplifier transistor Tr3 are provided at adjacent positions. The contact electrode 26 is provided in contact with the source-drain region 32F and the source-drain region 33F. That is, the contact electrode 26 is provided over two pixel regions P adjacent to each other in the row direction.

It is possible to combine the present modification example with the embodiment or the modification example 1 described above. Specifically, the contact voltage source VDD terminal may be shared together with the FD among four pixel regions P or between two pixel regions P In addition, it is possible to combine the present modification example with the modification example 2 described above. Specifically, the source-drain regions 32F and 33F may be provided with regions having different impurity concentrations.

Application Example

Figure 15:
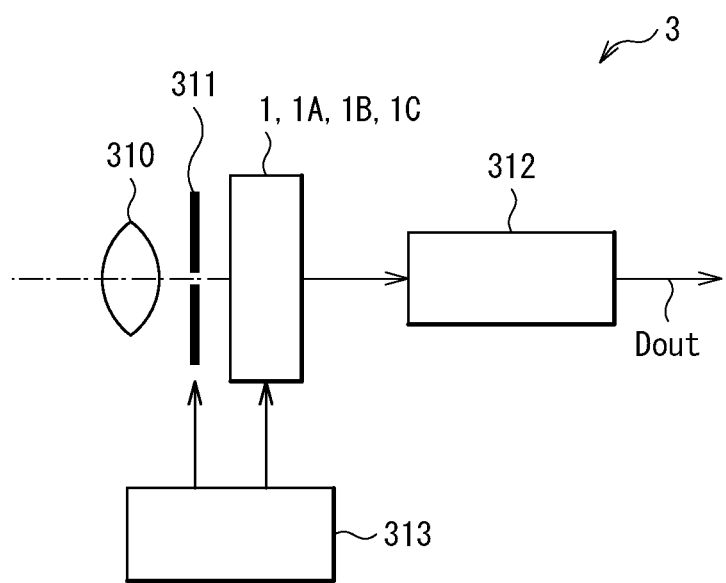

The imaging devices 1, 1A, B, and 1C described above (hereinafter referred to as the imaging device 1 for short) are applicable to various types of imaging apparatuses (electronic apparatuses), such as a camera that is able to capture an image of light of a wavelength in a visible region, for example. FIG. 15 illustrates a schematic configuration of an electronic apparatus 3 (camera) as an example of the imaging apparatus. The electronic apparatus 3 is, for example, a camera that is able to capture a still image or a moving image, and includes the imaging device 1, an optical system (optical lens) 310, a shutter device 311, a driver 313 that drives the imaging device 1 and the shutter device 311, and a signal processor 312.

The optical system 310 guides image light (incident light) from a subject to the imaging device 1. This optical system 310 may include a plurality of optical lenses. The shutter device 311 controls a period in which the imaging device 1 is irradiated with the light and a period in which the light is blocked. The driver 313 controls a transfer operation of the imaging device 1 and a shutter operation of the shutter device 311. The signal processor 312 performs various kinds of signal processing on a signal outputted from the imaging device 1. An image signal Dout having been subjected to the signal processing is stored in a storage medium such as a memory or outputted to a monitor or the like.

<Example of Practical Application to In-Vivo Information Acquisition System>

Further, the technology (present technology) according to the present disclosure is applicable to various products. For example, the technology according to the present disclosure may be applied to an endoscopic surgery system.

Figure 16:
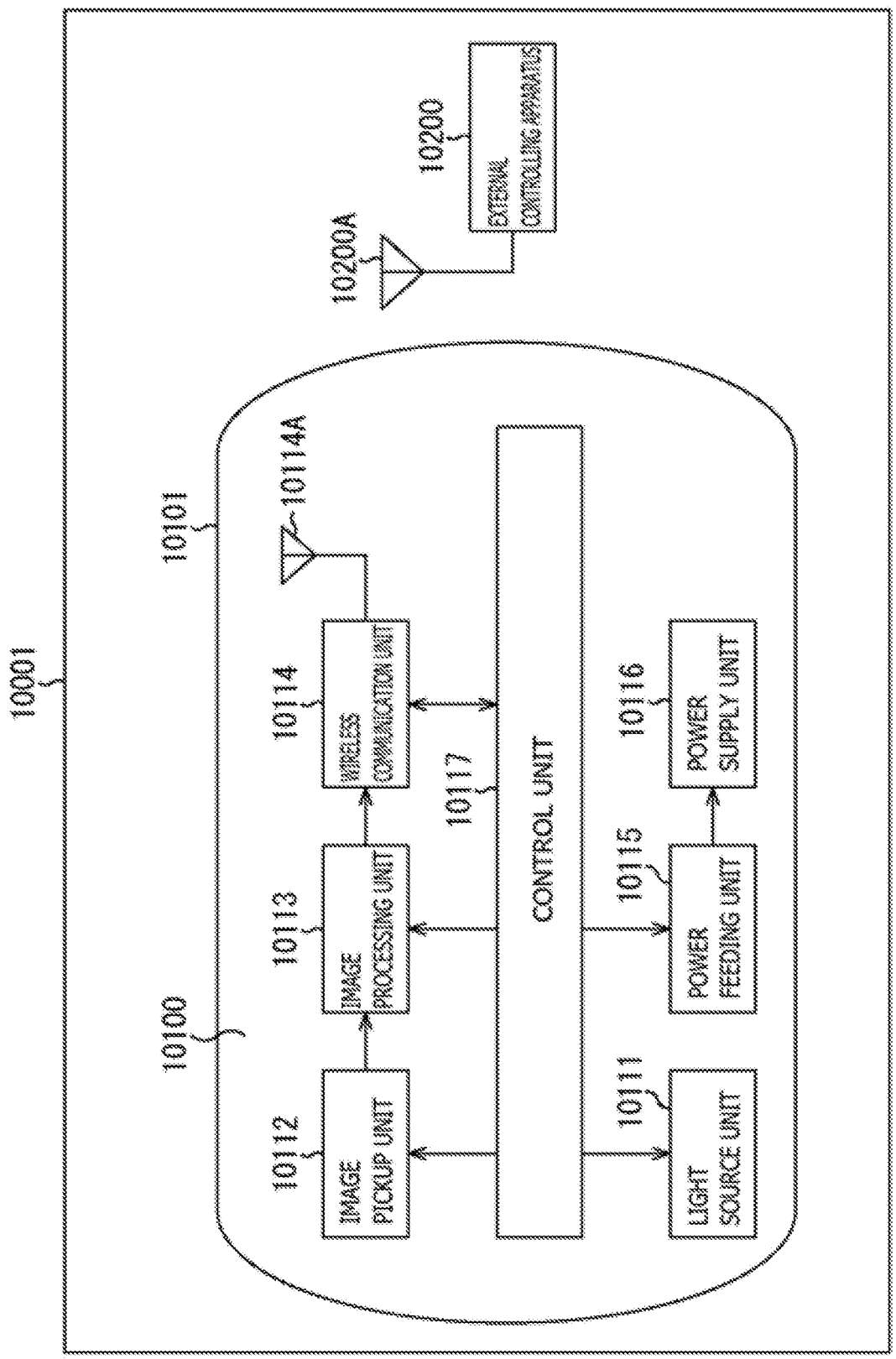
FIG. 16 is a block diagram depicting an example of a schematic configuration of an in-vivo information acquisition system.

FIG. 16 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 16, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure may be applied has been described above. The technology according to the present disclosure may be applied, for example, to the image pickup unit 10112 among the components described above. This makes it possible to increase detection accuracy.

<Example of Practical Application to Endoscopic Surgery System>

The technology (present technology) according to the present disclosure is applicable to various products. For example, the technology according to the present disclosure may be applied to an endoscopic surgery system.

Figure 17:
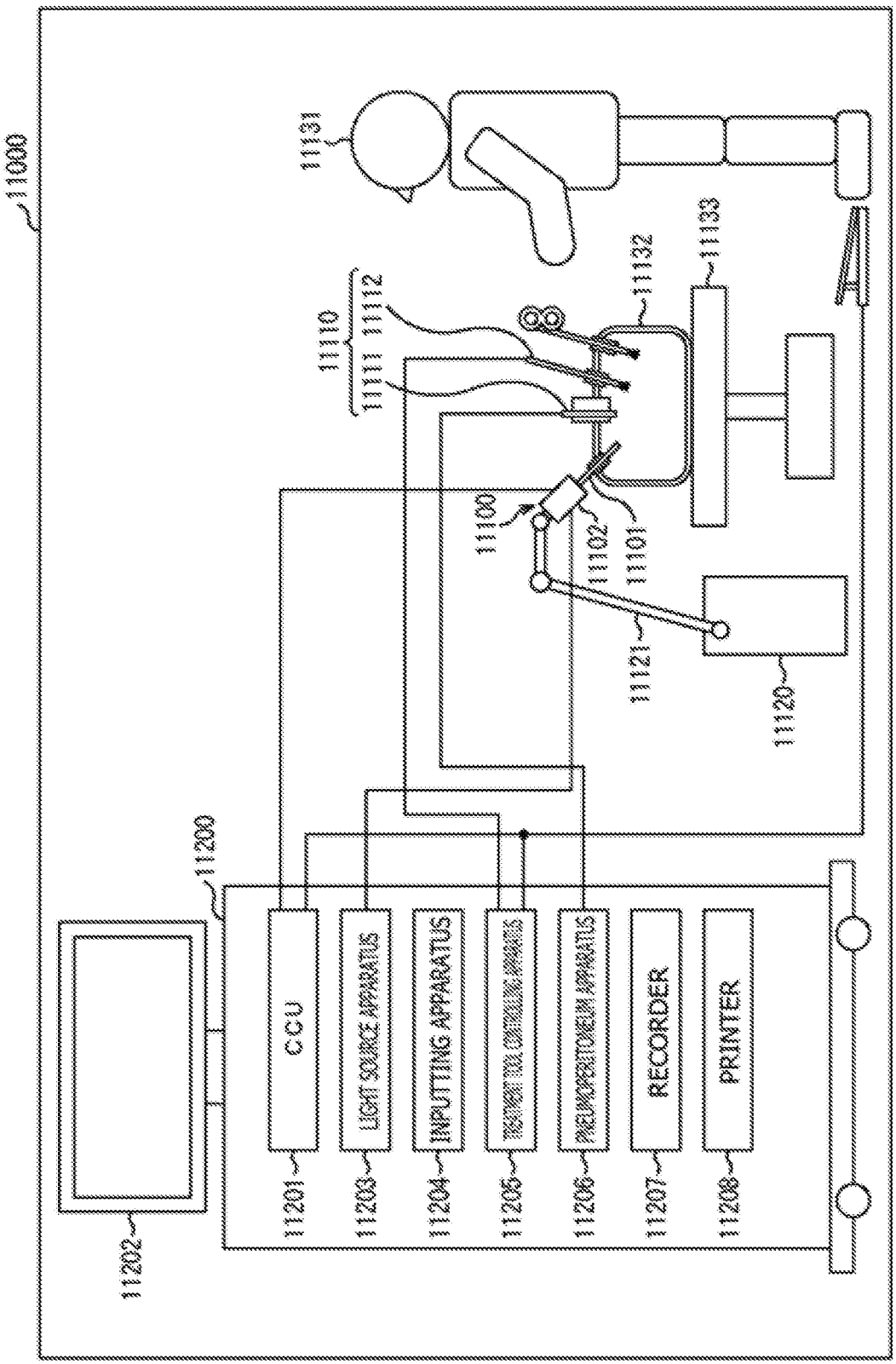
FIG. 17 is a view depicting an example of a schematic configuration of an endoscopic surgery system.

FIG. 17 is a view depicting an example of a schematic configuration of an endoscopic surgery system to which the technology according to an embodiment of the present disclosure (present technology) can be applied.

In FIG. 17, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R. G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 18:
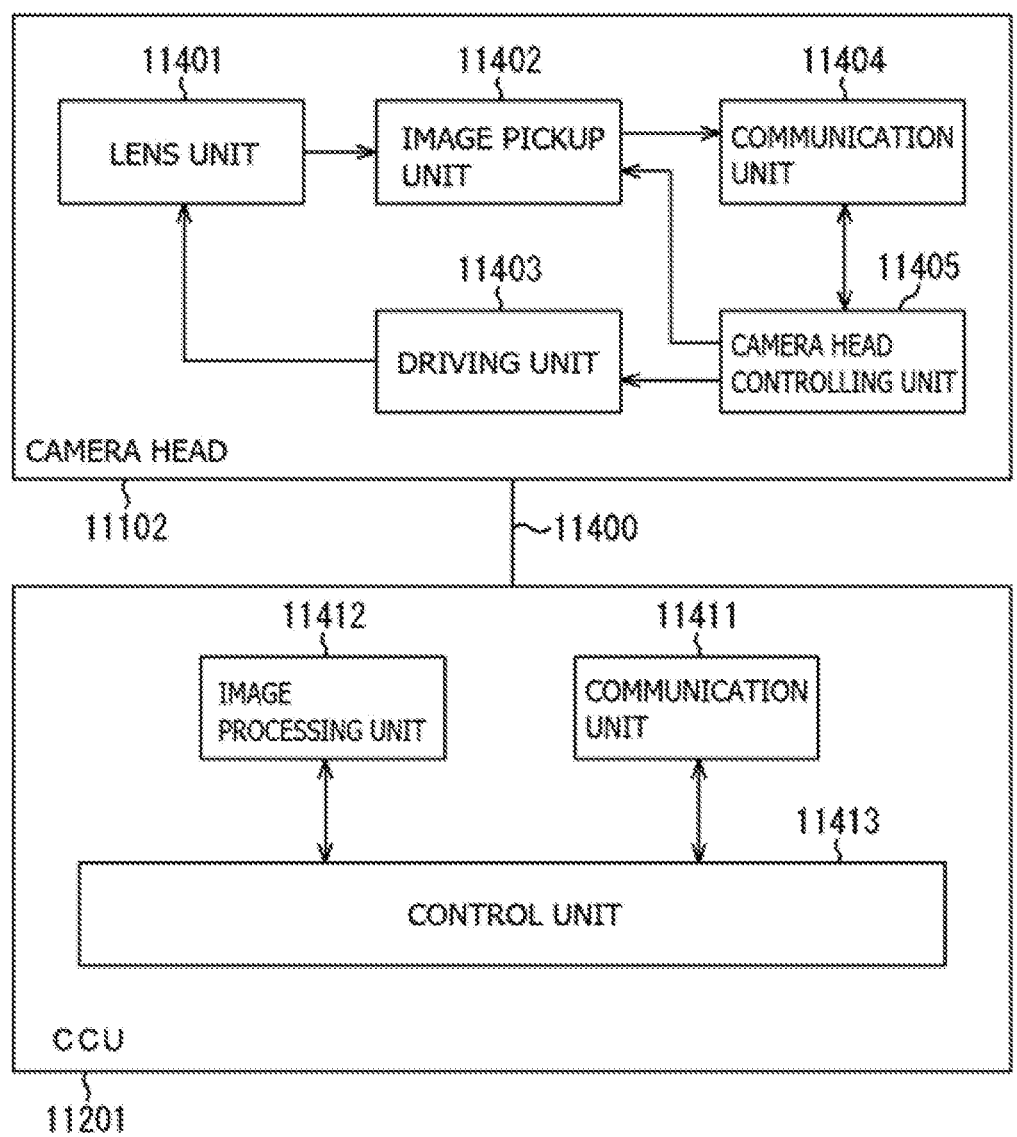
FIG. 18 is a block diagram depicting an example of a functional configuration of a camera head and a camera control unit (CCU).

FIG. 18 is a block diagram depicting an example of a functional configuration of the camera head 11102 and the CCU 11201 depicted in FIG. 17.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure may be applied has been described above. The technology according to the present disclosure may be applied to the image pickup unit 11402 among the components described above. Applying the technology according to the present disclosure to the image pickup unit 11402 increases detection accuracy.

It is to be noted that the endoscopic surgery system has been described here as one example, but the technology according to the present disclosure may be additionally applied to, for example, a microscopic surgery system or the like.

<Example of Practical Application to Mobile Body>

The technology according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

Figure 19:
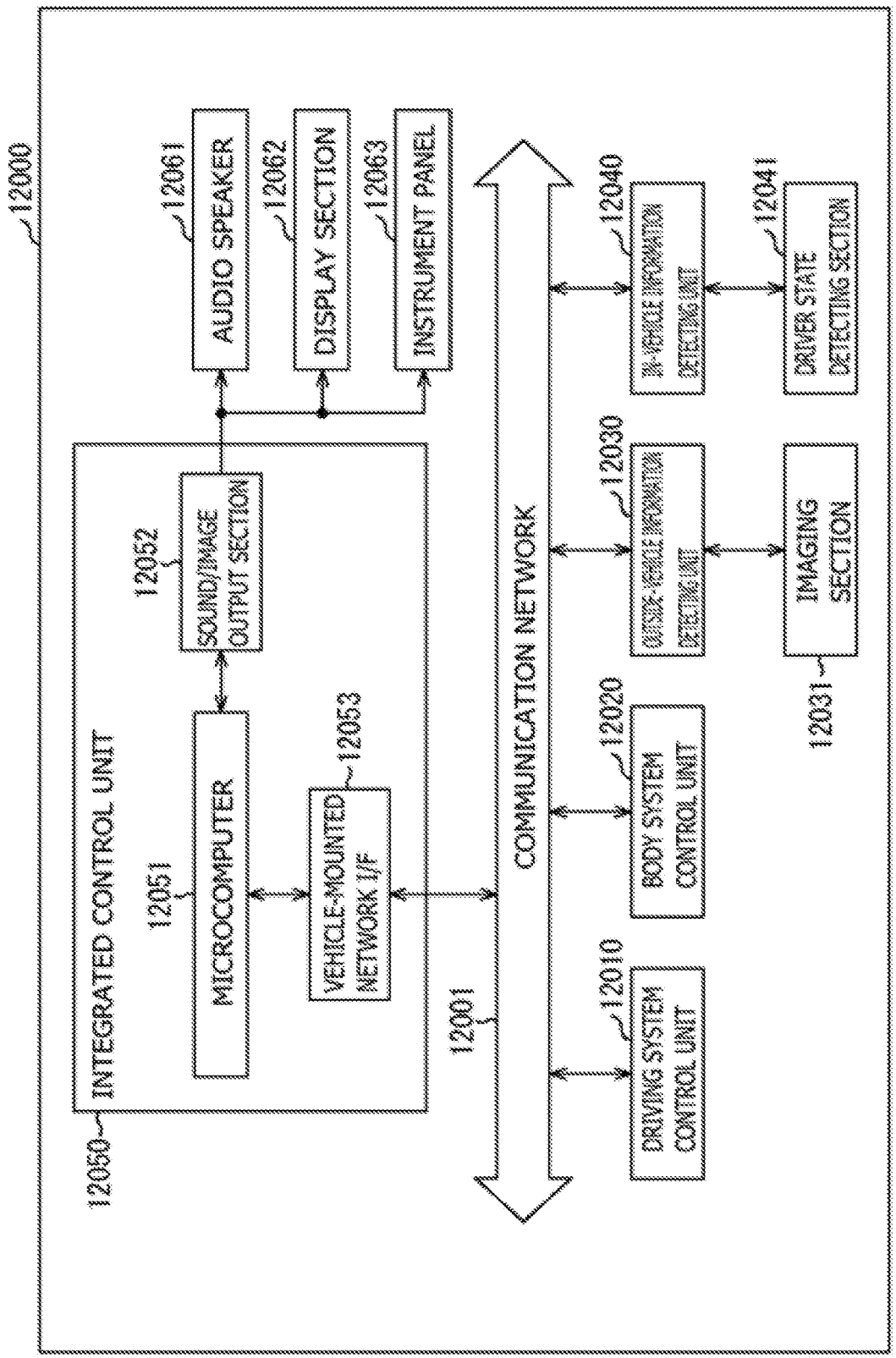
FIG. 19 is a block diagram depicting an example of schematic configuration of a vehicle control system.

FIG. 19 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 19, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

Figure 20:
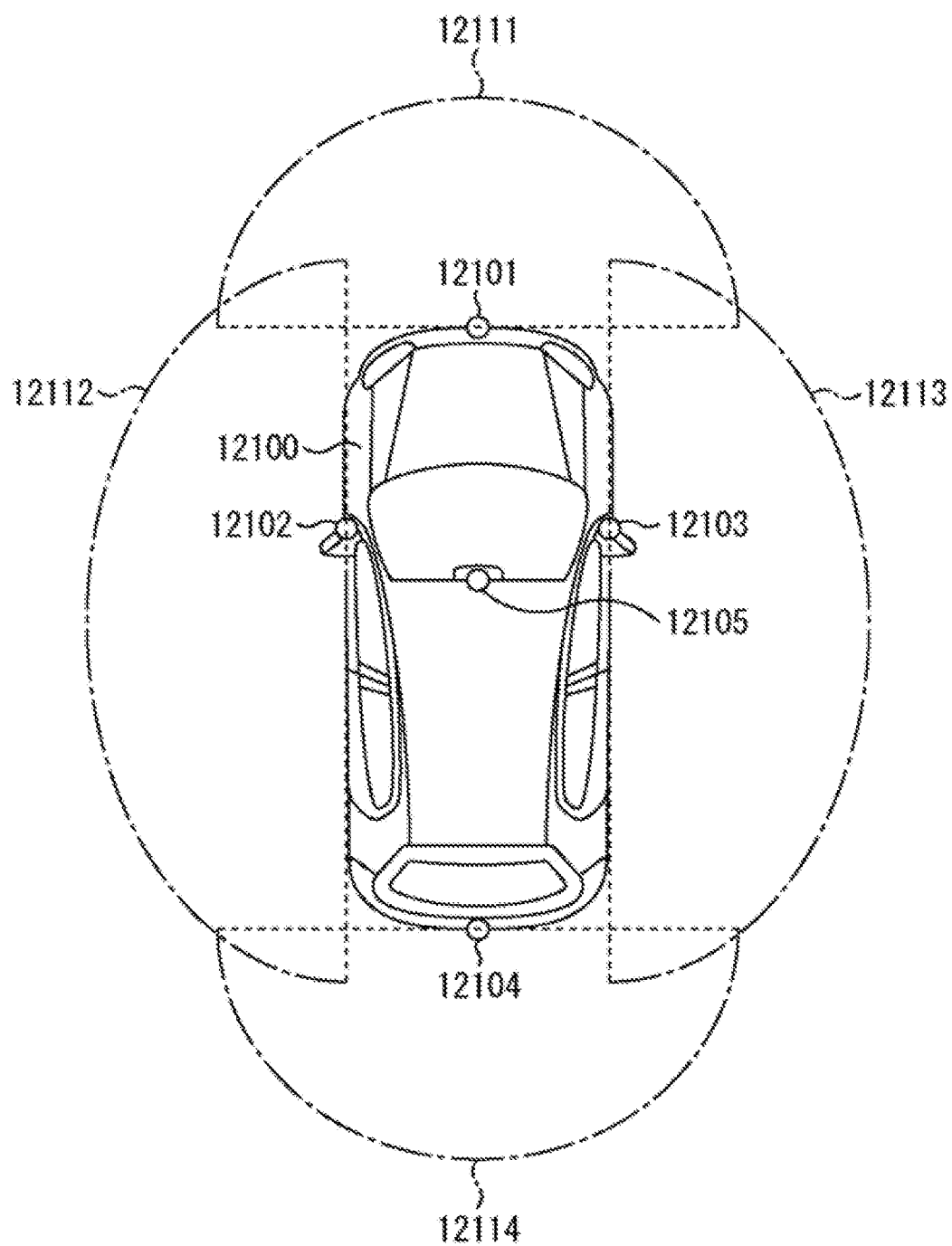
FIG. 20 is a diagram of assistance in explaining an example of installation positions of an outside-vehicle information detecting section and an imaging section.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

FIG. 20 is a diagram depicting an example of the installation position of the imaging section 12031.

In FIG. 20, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 20 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure may be applied to the imaging section 12031 among the components described above. Applying the technology according to the present disclosure to the imaging section 12031 makes it possible to obtain a captured image that is easier to see. Hence, it is possible to reduce fatigue of the driver The present disclosure has been described above with reference to the embodiment and the modification examples; however, the present disclosure contents are not limited to the embodiment and the like described above, and may be modified in a variety of ways. For example, the configurations of the imaging device and the like described in the embodiment above are merely exemplary, and may further include any other layer. In addition, the materials and thicknesses of the respective layers are merely exemplary as well, and are not limited to those described above.

Figure 21:
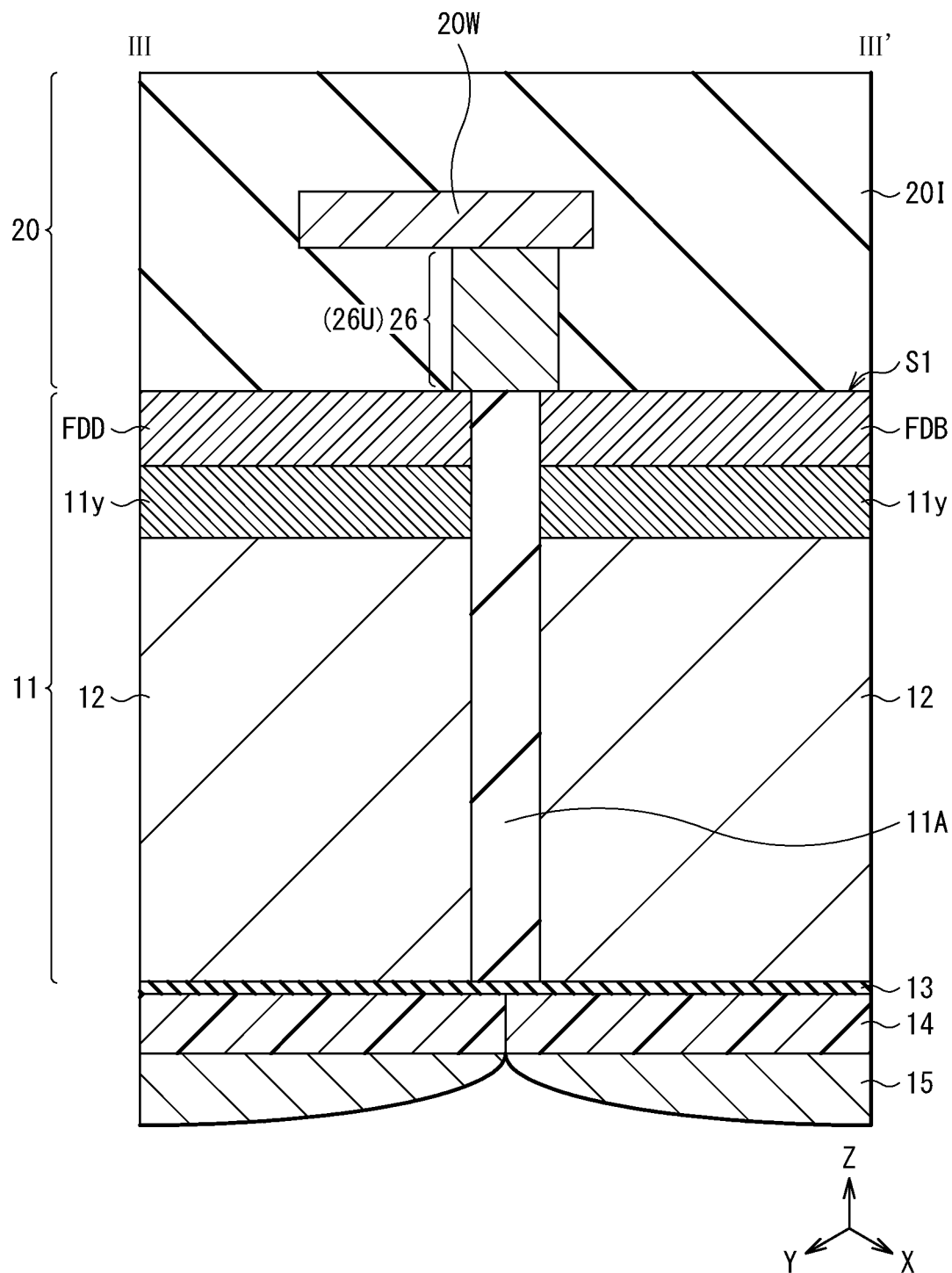
FIG. 21 is a schematic cross-sectional view of another example (2) of the configuration of the contact electrode illustrated in FIG. 4.

For example, in the embodiment and the like described above, description has been given of a case where the contact electrode 26 has the embedded portion 26D and the exposed portion 26U (see FIG. 3); however, as illustrated in FIG. 21, the contact electrode 26 may not have the embedded portion 26D. That is, the contact electrode 26 may include only the exposed portion 26U. It is possible to form such a contact electrode 26 easily. It is to be noted that FIG. 21 corresponds to the cross-sectional configuration taken along the line III-III' of FIG. 2.

In addition, in the embodiment and the like described above, one example of arrangement of the respective transistors (the transfer transistors, the reset transistor, the amplifier transistor, and the select transistor) has been described; however, the arrangement of the respective transistors may differ from the example.

In addition, in the embodiment and the like described above, one example of the configuration of a readout circuit has been described; however, the configuration of the readout circuit may differ from the example. For example, the readout circuit may not include the select transistor.

In addition, in the embodiment and the like described above, description has been given of an example in which the impurity diffusion region is shared between two pixels adjacent to each other in the row direction or the column direction or among four pixel regions P of two rows×two columns; however, the impurity diffusion region may be shared by any unit (for example, one row×two columns, three rows×three columns, or the like) other than a unit of two rows×two columns.

In addition, in the embodiment and the like described above, description has been given of a case where the impurity diffusion region includes an n-type impurity diffusion region; however, the impurity diffusion region may include a p-type impurity diffusion region, for example.

It is to be noted that the effects described in the embodiment and the like described above are merely exemplary, and may be any other effects or may further include any other effects.

It is to be noted that the present disclosure may have the following configurations.

(1)
A solid-state imaging device including:
- a semiconductor substrate having a first surface and a second surface opposed to each other, and including a photoelectric converter provided for each of pixel regions;
- an impurity diffusion region provided, for each of the pixel regions, in proximity to the first surface of the semiconductor substrate; and
- a contact electrode embedded in the semiconductor substrate from the first surface, and provided over and in contact with the impurity diffusion regions each provided for each of the pixel regions adjacent to each other.

(2)
The solid-state imaging device according to (1), further including a pixel separation groove provided between the pixel regions adjacent to each other, and penetrating through the semiconductor substrate from the first surface to the second surface.

(3)
The solid-state imaging device according to (2), in which the contact electrode is disposed at a position overlapping the pixel separation groove.

(4)

The solid-state imaging device according to any one of (1) to (3), in which at least a portion of a side surface of the contact electrode and a bottom surface of the contact electrode are in contact with the impurity diffusion region.

(5)

The solid-state imaging device according to any one of (1) to (4), in which the contact electrode includes an embedded portion embedded in the semiconductor substrate, and an exposed portion provided outside the semiconductor substrate.

(6)

The solid-state imaging device according to (5), in which a width of the exposed portion is equal to a width of the embedded portion.

(7)

The solid-state imaging device according to (5), in which the exposed portion is provided to have a wider width than the embedded portion.

(8)

The solid-state imaging device according to any one of (1) to (7), in which the contact electrode is provided over and in contact with the impurity diffusion regions each provided for each of two pixel regions.

(9)

The solid-state imaging device according to any one of (1) to (8), in which the contact electrode is provided over and in contact with the impurity diffusion regions each provided for each of four pixel regions.

(10)

The solid-state imaging device according to any one of (1) to (9), in which the impurity diffusion region configures an electric charge accumulation section in which a signal electric charge generated in the photoelectric converter is accumulated.

(11)

The solid-state imaging device according to any one of (1) to (9), further including a transistor provided for each of the pixel regions adjacent to each other, in which the impurity diffusion region configures a source-drain region of the transistor.

(12)

The solid-state imaging device according to (11), in which the contact electrode is coupled to a VDD potential.

(13)

The solid-state imaging device according to any one of (1) to (12), in which the impurity diffusion region includes a first impurity diffusion region in contact with the contact electrode, and a second impurity diffusion region that is disposed at a position farther than the first impurity diffusion region from the contact electrode and has an impurity concentration lower than an impurity concentration of the first impurity diffusion region.

(14)

The solid-state imaging device according to any one of (1) to (13), in which the impurity diffusion region includes an n-type impurity diffusion region.

(15)

A solid-state imaging apparatus provided with a solid-state imaging device, the solid-state imaging device including:

a semiconductor substrate having a first surface and a second surface opposed to each other, and including a photoelectric converter provided for each of pixel regions;

an impurity diffusion region provided, for each of the pixel regions, in proximity to the first surface of the semiconductor substrate; and a contact electrode embedded in the semiconductor substrate from the first surface, and provided over and in contact with the impurity diffusion regions each provided for each of the pixel regions adjacent to each other.

This application claims the benefit of Japanese Priority Patent Application JP2018-94226 filed with the Japan Patent Office on May 16, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A light detecting device, comprising:
a substrate;
a first pixel including a first photoelectric conversion region and a first transistor;
a second pixel including a second photoelectric conversion region and a second transistor;
a pixel separating trench disposed in the substrate between the first photoelectric conversion region and the second photoelectric conversion region in a cross-sectional view; and
a contact electrode disposed in a part of the pixel separating trench and in contact with a source/drain region of the first transistor and a source/drain region of the second transistor,
wherein the first pixel is adjacent to the second pixel.

2. The light detecting device according to claim 1, wherein the source/drain region of the first transistor and the source/drain region of the second transistor are a n-type impurity diffusion region.

3. The light detecting device according to claim 1, wherein the first is a reset transistor, the second transistor is an amp transistor.

4. The light detecting device according to claim 1, wherein the contact electrode includes first, second, third and fourth sides in the cross-sectional view.

5. The light detecting device according to claim 4, the first side and the second side are contact with the source/drain region of the first transistor.

6. The light detecting device according to claim 4, wherein the third side and the fourth side are contact with the source/drain region of the second transistor.

7. The light detecting device according to claim 4, wherein the first side is perpendicular to the second side.

8. The light detecting device according to claim 4, wherein the third side is perpendicular to the fourth side.

9. The light detecting device according to claim 1, wherein the first transistor and the second transistor are shared by the first pixel and the second pixel.

10. The light detecting device according to claim 1, wherein a part of the contact electrode is disposed outside the substrate in the cross-sectional view.

11. The light detecting device according to claim 10, wherein a width of the part of the contact electrode is wider than a width of another part of the contact electrode in the cross-sectional view.

12. The light detecting device according to claim 4, wherein a part of the contact electrode is disposed outside the substrate in the cross-sectional view.

13. A light detecting apparatus, comprising:
a light detecting device, comprising:
  a substrate;
  a first pixel including a first photoelectric conversion region and a first transistor;
  a second pixel including a second photoelectric conversion region and a second transistor;
    a pixel separating trench disposed in the substrate between the first photoelectric conversion region and the second photoelectric conversion region in a cross-sectional view; and
    a contact electrode disposed in a part of the pixel separating trench and in contact with a source/drain region of the first transistor and a source/drain region of the second transistor,
    wherein the first pixel is adjacent to the second pixel.

14. The light detecting apparatus according to claim 13, wherein the source/drain region of the first transistor and the source/drain region of the second transistor are a n-type impurity diffusion region.

15. The light detecting apparatus according to claim 13, wherein the first is a reset transistor, the second transistor is an amp transistor.

16. The light detecting apparatus according to claim 13, wherein the contact electrode includes first, second, third and fourth sides in the cross-sectional view.

17. The light detecting apparatus according to claim 16, the first side and the second side are contact with the source/drain region of the first transistor.

18. The light detecting apparatus according to claim 16, wherein the third side and the fourth side are contact with the source/drain region of the second transistor.

19. The light detecting apparatus according to claim 16, wherein the first side is perpendicular to the second side.

20. The light detecting apparatus according to claim 16, wherein the third side is perpendicular to the fourth side.

* * * * *